(12) United States Patent
Dunfield

(10) Patent No.: US 6,803,561 B2
(45) Date of Patent: Oct. 12, 2004

(54) FREQUENCY TUNABLE RESONANT SCANNER

(75) Inventor: John C. Dunfield, Woodinville, WA (US)

(73) Assignee: Microvision, Inc., Bothell, WA (US)

( * ) Notice: Subject to any disclaimer, the term of this patent is extended or adjusted under 35 U.S.C. 154(b) by 0 days.

(21) Appl. No.: 10/318,457

(22) Filed: Dec. 13, 2002

(65) Prior Publication Data

US 2003/0122066 A1 Jul. 3, 2003

Related U.S. Application Data

(62) Division of application No. 09/947,642, filed on Sep. 6, 2001, now Pat. No. 6,525,310, which is a continuation of application No. 09/370,791, filed on Aug. 5, 1999, now Pat. No. 6,331,909.

(51) Int. Cl.[7] .................................................. H01J 3/14
(52) U.S. Cl. ...................................... 250/235; 250/216
(58) Field of Search ............................... 250/234, 235, 250/216, 221; 359/197–203, 207, 213

(56) References Cited

U.S. PATENT DOCUMENTS

| | | |
|---|---|---|
| 4,429,564 A | 2/1984 | Ikeda et al. |
| 4,782,334 A | 11/1988 | Meaney |
| 4,874,215 A | 10/1989 | Montagu |
| 5,165,279 A | 11/1992 | Norling et al. |
| 5,367,878 A | 11/1994 | Muntz et al. |
| 5,451,425 A | 9/1995 | Vig |
| 5,467,104 A | 11/1995 | Furness et al. |
| 5,488,862 A | 2/1996 | Neukermans et al. |
| 5,557,444 A | 9/1996 | Melville et al. |
| 5,629,790 A | 5/1997 | Neukermans et al. |
| 5,640,133 A | 6/1997 | MacDonald et al. |
| 5,645,735 A | 7/1997 | Bennin et al. |
| 5,648,618 A | 7/1997 | Neukermans et al. |
| 5,701,132 A | 12/1997 | Kollin et al. |
| 5,841,553 A | 11/1998 | Neukermans et al. |
| 5,969,465 A | 10/1999 | Neukermans et al. |
| 6,044,705 A | 4/2000 | Neukermans et al. |
| 6,064,779 A | 5/2000 | Neukermans et al. |
| 6,122,394 A | 9/2000 | Neukermans et al. |
| 6,245,590 B1 * | 6/2001 | Wine et al. ................... 438/52 |
| 6,512,622 B2 * | 1/2003 | Wine et al. ................. 359/199 |

OTHER PUBLICATIONS

Nagle, Schiffman & Gutierrez–Osuna, "The How and Why of Electronic Noses," IEES Spectrum, Sep., 1998.

* cited by examiner

Primary Examiner—Que T. Le

(57) ABSTRACT

A display apparatus includes a scanning assembly that scans about two or more axes, typically in a raster pattern. A plurality of light sources emit light from spaced apart locations toward the scanning assembly such that the scanning assembly simultaneously scans more than one of the beams. The scanning assembly is a resonant scanning assembly with a variable resonant frequency. The resonant frequency of the scanning assembly can be actively controlled by controlling partial pressure of fluids in a package containing the scanning assembly. In one embodiment, the increased partial pressure increases the mass of a scanning mirror, thereby changing the resonant frequency. In another embodiment, a gas absorbing material is coupled to a support arm that carries a scanning mirror. As the gas absorbing material absorbs gas, its physical properties change, thereby shifting the resonant frequency of the scanning assembly. Monitoring the resonant frequency relative to a desired frequency provides in error signal that can be used to frequency lock the resonant scanning assembly to an input signal.

6 Claims, 23 Drawing Sheets

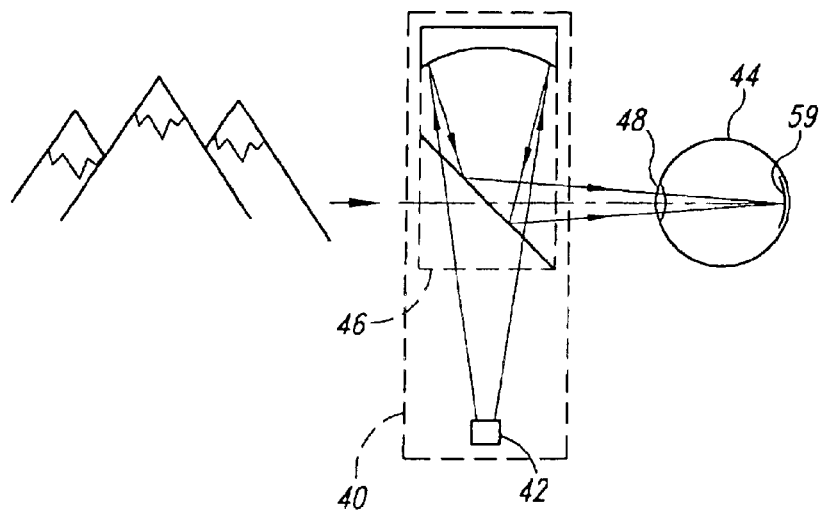
Fig. 1
*(Prior Art)*
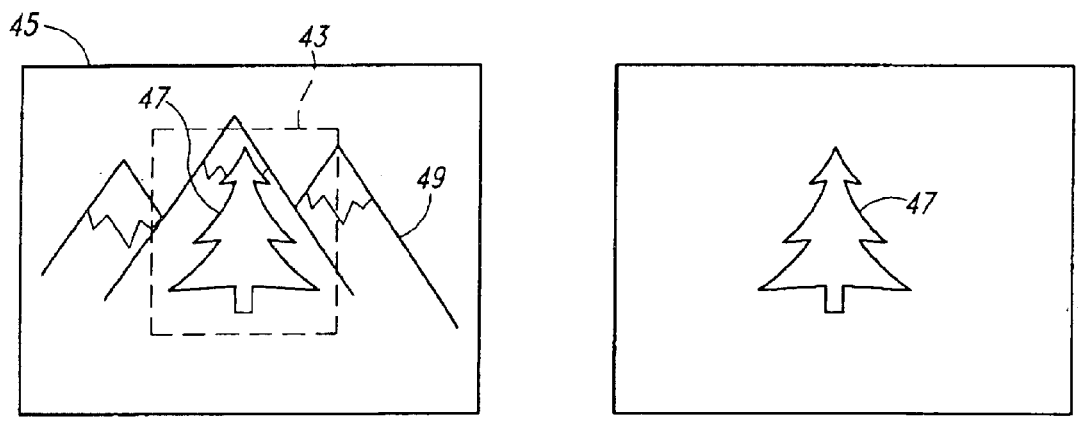
Fig. 2A
*(Prior Art)*
Fig. 2B
*(Prior Art)*

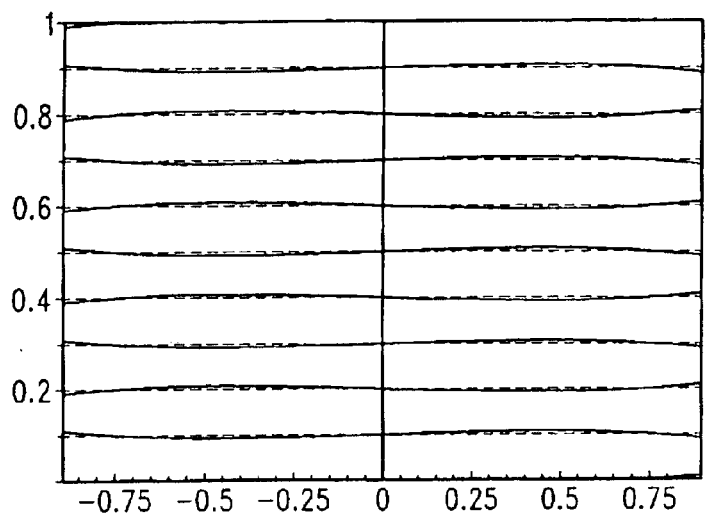
Fig. 18
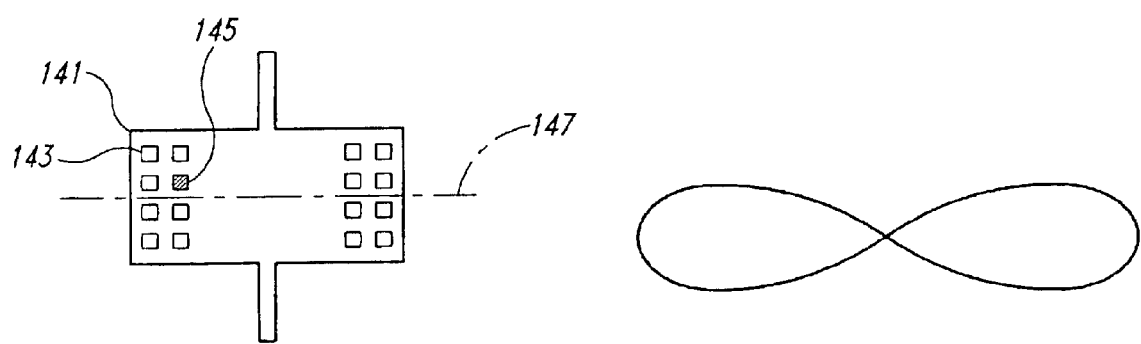
Fig. 19
Fig. 20

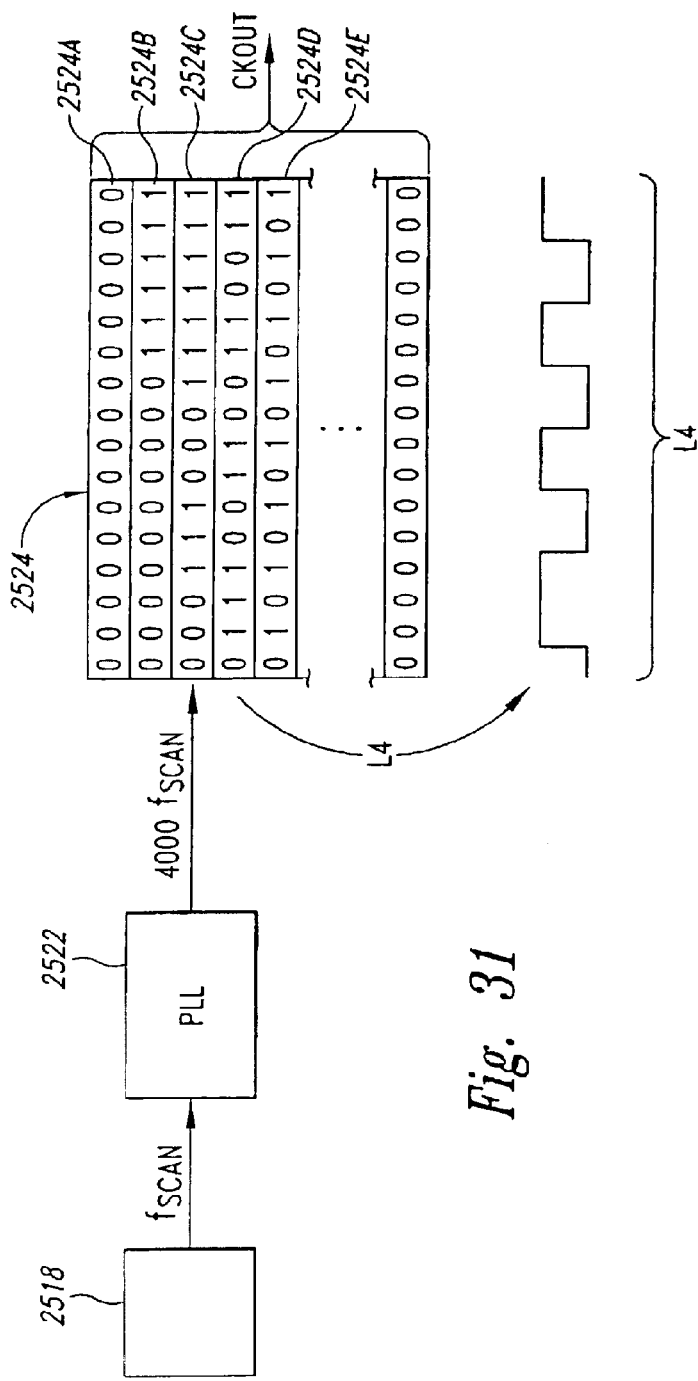

FREQUENCY TUNABLE RESONANT SCANNER

This application is a division of application Ser. No. 09/947,642 filed Sep. 6, 2001 now U.S. Pat. No. 6,525,310, which is a continuation of application Ser. No. 09/370,791, filed Aug. 5 1999 now U.S. Pat. No. 6,331,909.

TECHNICAL FIELD

The present invention relates to resonant microelectromechanical devices and, more particularly, to control of frequency in such devices.

BACKGROUND OF THE INVENTION

A variety of techniques are available for providing visual displays of graphical or video images to a user. In many applications cathode ray tube type displays (CRTs), such as televisions and computer monitors produce images for viewing. Such devices suffer from several limitations. For example, CRTs are bulky and consume substantial amounts of power, making them undesirable for portable or head-mounted applications.

Matrix addressable displays, such as liquid crystal displays and field emission displays, may be less bulky and consume less power. However, typical matrix addressable displays utilize screens that are several inches across. Such screens have limited use in head mounted applications or in applications where the display is intended to occupy only a small portion of a user's field of view. Such displays have been reduced in size, at the cost of increasingly difficult processing and limited resolution or brightness. Also, improving resolution of such displays typically requires a significant increase in complexity.

One approach to overcoming many limitations of conventional displays is a scanned beam display, such as that described in U.S. Pat. No. 5,467,104 of Furness et al., entitled VIRTUAL RETINAL DISPLAY, which is incorporated herein by reference. As shown diagrammatically in FIG. 1, in one embodiment of a scanned beam display 40, a scanning source 42 outputs a scanned beam of light that is coupled to a viewer's eye 44 by a beam combiner 46. In some scanned displays, the scanning source 42 includes a scanner, such as scanning mirror or acousto-optic scanner, that scans a modulated light beam onto a viewer's retina. In other embodiments, the scanning source may include one or more light emitters that are rotated through an angular sweep.

The scanned light enters the eye 44 through the viewer's pupil 48 and is imaged onto the retina 59 by the cornea. In response to the scanned light the viewer perceives an image. In another embodiment, the scanned source 42 scans the modulated light beam onto a screen that the viewer observes. One example of such a scanner suitable for either type of display is described in U.S. Pat. No. 5,557,444 to Melville et al., entitled MINIATURE OPTICAL SCANNER FOR A TWO-AXIS SCANNING SYSTEM, which is incorporated herein by reference.

In another embodiment, a micro-electromechanical (MEMs) device operates as the scanner. The MEMs scanner may be uniaxial or biaxial. A number of MEMs scanners are known. For example, one such scanner is described in U.S. Pat. No. 5,629,790 to Neukermanns et al., entitled MICRO-MACHINED TORSIONAL SCANNER.

Where such MEMs scanners are resonant devices, it may be difficult to synchronize the scanning frequency of the MEMs device to a desired frequency. For example, where the MEMs scanner scans a beam that is modulated according to the horizontal synchronization component of a video signal, incoming data is modulated at a line rate that may or may not match the resonant frequency of the MEMs scanner. Similarly, where the scanner is used as an input device, decoding electronics may utilize a line rate that differs from the resonant frequency of the MEMs scanner.

Returning to display applications, sometimes such displays are used for partial or augmented view applications. In such applications, a portion of the display is positioned in the user's field of view and presents an image that occupies a region 43 of the user's field of view 45, as shown in FIG. 2A. The user can thus see both a displayed virtual image 47 and background information 49. If the background light is occluded, the viewer perceives only the virtual image 47, as shown in FIG. 2B.

One difficulty that may arise with such displays is raster pinch, as will now be explained with reference to FIGS. 3–5. As shown diagrammatically in FIG. 3, the scanning source 42 includes an optical source 50 that emits a beam 52 of modulated light. In this embodiment, the optical source 50 is an optical fiber that is driven by one or more light emitters, such as laser diodes (not shown). A lens 53 gathers and focuses the beam 52 so that the beam 52 strikes a turning mirror 54 and is directed toward a horizontal scanner 56. The horizontal scanner 56 is a mechanically resonant scanner that scans the beam 52 periodically in a sinusoidal fashion. The horizontally scanned beam then travels to a vertical scanner 58 that scans periodically to sweep the horizontally scanned beam vertically. For each angle of the beam 52 from the scanners 58, an exit pupil expander 62 converts the beam 52 into a set of beams 63. Eye coupling optics 60 collect the beams 63 and form a set of exit pupils 65. The exit pupils 65 together act as an expanded exit pupil for viewing by a viewer's eye 64. One such expander is described in U.S. Pat. No. 5,701,132 of Kollin et al., entitled VIRTUAL RETINAL DISPLAY WITH EXPANDED EXIT PUPIL, which is incorporated herein by reference. One skilled in the art will recognize that, for differing applications, the exit pupil expander 62 may be omitted, may be replaced or supplemented by an eye tracking system, or may have a variety of structures, including diffractive or refractive designs. For example, the exit pupil expander 62 may be a planar or curved structure and may create any number or pattern of output beams in a variety of patterns. Also, although only three exit pupils are shown in FIG. 3, the number of pupils may be almost any number. For example, in some applications a 15 by 15 array may be suitable.

Returning to the description of scanning, as the beam scans through each successive location in the beam expander 62, the beam color and intensity is modulated in a fashion to be described below to form a respective pixel of an image. By properly controlling the color and intensity of the beam for each pixel location, the display 40 can produce the desired image.

Simplified versions of the respective waveforms of the vertical and horizontal scanners are shown in FIG. 4. In the plane 66 (FIG. 3), the beam traces the pattern 68 shown in FIG. 5. Though FIG. 5 shows only eleven lines of image, one skilled in the art will recognize that the number of lines in an actual display will typically be much larger than eleven. As can be seen by comparing the actual scan pattern 68 to a desired raster scan pattern 69, the actual scanned beam 68 is "pinched" at the outer edges of the beam expander 62. That is, in successive forward and reverse sweeps of the beam, the pixels near the edge of the scan pattern are unevenly spaced. This uneven spacing can cause the pixels to overlap or can leave a gap between adjacent rows of pixels. Moreover, because the image information is typically provided as an array of data, where each location in the array corresponds to a respective position in the ideal raster pattern 69, the displaced pixel locations can cause image distortion.

For a given refresh rate and a given wavelength, the number of pixels per line is determined in the structure of FIG. 3 by the mirror scan angle θ and mirror dimension D perpendicular to the axis of rotation. For high resolution, it is therefor desirable to have a large scan angle θ and a large mirror. However, larger mirrors and scan angles typically correspond to lower resonant frequencies. A lower resonant frequency provides fewer lines of display for a given period. Consequently, a large mirror and larger scan angle may produce unacceptable refresh rates.

SUMMARY OF THE INVENTION

A display includes a primary scanning mechanism that simultaneously scans a plurality of beams of light both horizontally and vertically along substantially continuous scan paths where each beam defines a discrete "tile" of an image. In the preferred embodiment, the scanning mechanism includes a mirror that pivots to sweep the beams horizontally.

Optical sources are aligned to provide the beams of light to the scanning mechanism from respective input angles. The input angles are selected such that the scanning mechanism sweeps each beam of light across a respective distinct region of an image field. Because the respective regions are substantially non-overlapping, each beam of light generates a substantially spatially distinct region of the image. The respective regions are immediately adjacent or may overlap slightly, so that the spatially distinct regions are "tiled" to form a contiguous image. Because movement of the mirror produces movement of all of the beams, the display produces each of the spatially separate regions simultaneously. As described above, the scan angle θ and the mirror dimensions determine the number of pixels drawn for each beam. The total number of pixels in a line can thus substantially equal the number of pixels for each beam multiplied by the number of beams.

In one embodiment, the scanning mechanism scans in a generally raster pattern with a horizontal component and a vertical component. A mechanically resonant scanner produces the horizontal component by scanning the beam sinusoidally. A non-resonant or semi-resonant scanner typically scans the beam vertically with a substantially constant angular speed.

In one embodiment, the scanning mechanism includes a biaxial microelectromechanical (MEMs) scanner. The biaxial scanner uses a single mirror to provide both horizontal and vertical movement of each of the beams. In one embodiment, the display includes a buffer that stores data and outputs the stored data to each of the optical sources. A correction multiplier provides correction data that adjusts the drive signals to the optical sources in response to the stored data. The adjusted drive signals compensate for variations in output intensity caused by pattern dependent heating.

In another embodiment, an imager acquires images in tiles by utilizing two separate detector and optical source pairs. One embodiment of the imager includes LEDs or lasers as the optical sources, where each of the optical sources is at a respective wavelength. The scanning assembly simultaneously directs light from each of the optical sources to respective regions of an image field. For each location in the image field, each of the detectors selectively detects light at the wavelength, polarization, or other characteristic of its corresponding source, according to the reflectivity of the respective location. The detectors output electrical signals to decoding electronics that store data representative of the image field.

In one embodiment, the imager includes a plurality of detector/optical source pairs at each of red, green, and blue wavelength bands. Each pair operates at a respective wavelength within its band. For example, a first of the red pairs operates at a first red wavelength and a second of the red pairs operates at a second red wavelength different from the first.

In one embodiment, a pair of optical sources alternately feed a single scanner from different angles. During forward sweeps of the scanner, a first of the sources emits light modulated according to one half of a line. During the return sweep, the second source emits light modulated according to the second half of the line. Because the second sweep is in the opposite direction from the first, data corresponding to the second half of the line is reversed before being applied to the second source so that light from the second source is modulated to write the second half of the line in reverse.

In one embodiment of the alternate feeding approach, a single light emitter feeds an input fiber that is selectively coupled to one of two separate fibers by an optical switch. During forward sweeps, the optical switch couples the input fiber to a first of the separate fibers so that the first separate fiber forms the first optical source. During reverse sweep, the optical switch feeds the second separate fiber so that the second separate fiber forms the second source. This embodiment thus allows a single light emitter to provide light for both optical sources.

The alternate feeding approach can be expanded to write more than just two tiles. In one approach, the input fiber is coupled to four fibers by a set of optical switches, where each fiber feeds the scanning assembly from a respective angle. The switches are activated according to the direction of the sweep and according to the tracked location of the user's vision. For example, when the user looks at the top half of the image, a first fiber, aligned to produce an image in the upper left tile feeds the scanner during the forward sweeps. A second fiber, aligned to produce an upper right tile feeds the scanner during reverse sweeps. When the user looks at the lower half of the image, a third fiber, aligned to produce the lower left tile, feeds scanner during forward sweeps. A fourth fiber, aligned to produce the lower right tile, feeds the scanner during reverse sweeps.

BRIEF DESCRIPTION OF THE FIGURES

FIG. 1 is a diagrammatic representation of a display aligned to a viewer's eye.

FIG. 2A is a combined image perceived by a user resulting from the combination of light from an image source and light from a background.

FIG. 2B is an image perceived by a user from the display of FIG. 1 where the background light is occluded.

FIG. 18 shows corrected scan position using a sinusoidally driven scanner through 90% of the overall scan.

FIG. 19 shows an alternative embodiment of a reduced error scanner where scan correction is realized by adding a vertical component to the horizontal mirror.

FIG. 20 is a position diagram showing the scan path of a beam deflected by the scanner of FIG. 19.

FIG. 31 is a detail block diagram of a clock generation portion of the block diagram of FIG. 29.

FIG. 32 is a representation of a data structure showing data predistorted to compensate for vertical optical distortion.

DETAILED DESCRIPTION OF THE INVENTION

Figure 6:
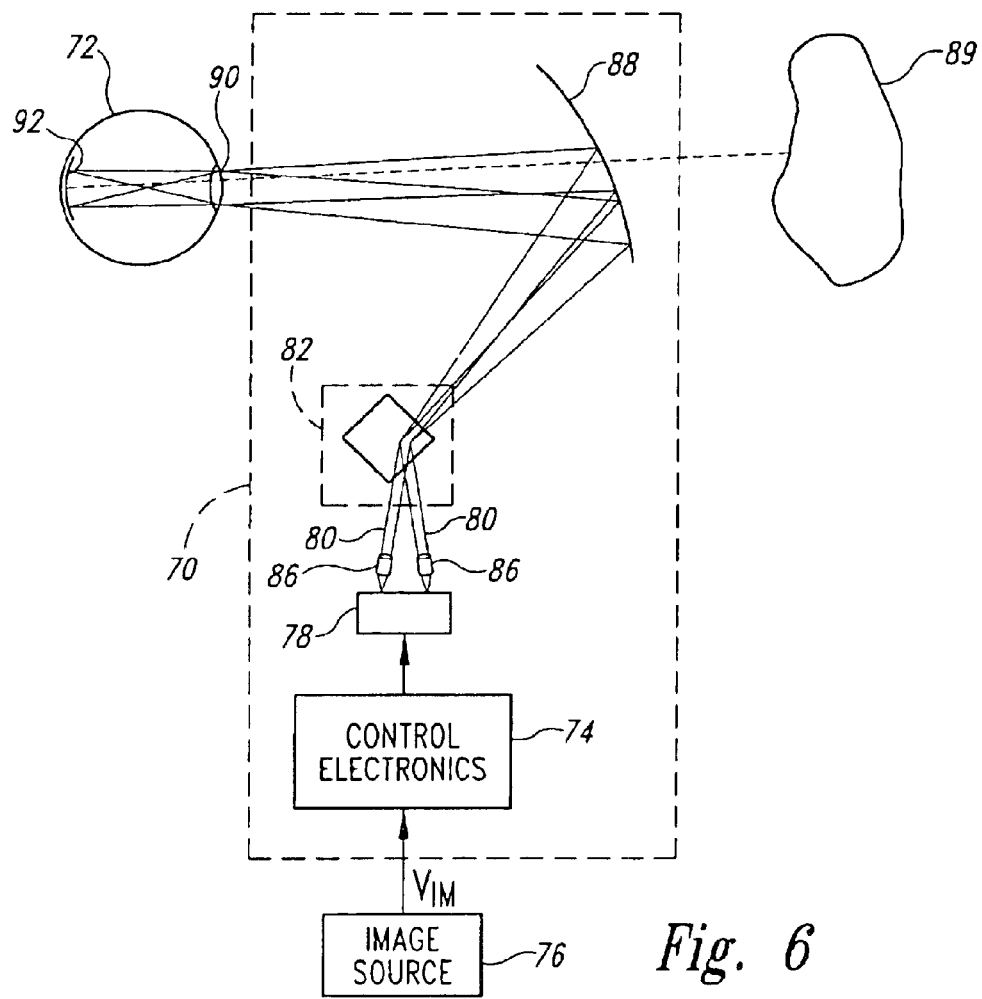
FIG. 6 is a diagrammatic representation of a display according to the one embodiment invention including dual light beams.

As shown in FIG. 6, a scanned beam display 70 according to one embodiment of the invention is positioned for viewing by a viewer's eye 72. While the display 70 is presented herein is scanning light into the eye 72, the structures and concepts described herein can also be applied to other types of displays, such as projection displays that include viewing screens.

The display 70 includes four principal portions, each of which will be described in greater detail below. First, control electronics 74 provide electrical signals that control operation of the display 70 in response to an image signal $V_{IM}$ from an image source 76, such as a computer, television receiver, videocassette player, DVD player, remote sensor, or similar device.

The second portion of the display 70 is a light source 78 that outputs modulated light beams 80, each having a modulation corresponding to information in the image signal $V_{IM}$. The light source 78 may utilize coherent light emitters, such as laser diodes or microlasers, or may use non-coherent sources such as light emitting diodes. Also, the light source 78 may include directly modulated light emitters such as the light emitting diodes (LEDs) or may include continuous light emitters indirectly modulated by external modulators, such as acousto-optic modulators.

The third portion of the display 70 is a scanning assembly 82 that scans the modulated beams 80 through two-dimensional scanning patterns, such as raster patterns. The scanning assembly 82 preferably includes a periodically scanning mirror or mirrors as will be described in greater detail below with reference to FIGS. 3–4, 8, 11, 19–22.

Lenses 84, 86 positioned on opposite sides of the scanning assembly 82 act as imaging optics that form the fourth portion of the display 70. The lenses 86 are cylindrical graded index (GRIN) lenses that gather and shape light from the light source 78. Where the light source 78 includes optical fibers that feed the lenses 86, the lenses 86 may be bonded to or integral to the fibers. Alternatively, other types of lenses, such as doublets or triplets, may form the lenses 86. Also, other types of optical elements such as diffractive elements may be used to shape and guide the light. Regardless of the type of element, the overall optical train may incorporate polarization sensitive materials, chromatic correction, or any other optical technique for controlling the shape, phase or other characteristics of the light.

The lens 84 is formed from a curved, partially transmissive mirror that shapes and focuses the scanned beams 80 approximately for viewing by the eye 72. After leaving the lens 84, the scanned beams 80 enter the eye 72 through a pupil 90 and strike the retina 92. As each beam of scanned modulated light strikes the retina 92, the viewer perceives a respective portion of the image as will be described below.

Because the lens 84 is partially transmissive, the lens 84 combines the light from the scanning assembly 82 with the light received from a background 89 to produce a combined input to the viewer's eye 72. Although the background 89 is presented herein as a "real-world" background, the background light may be occluded or may be produced by another light source of the same or different type. One skilled in the art will recognize that a variety of other optical elements may replace or supplement the lenses 84, 86. For example, diffractive elements such as Fresnel lenses may replace either or both of the lenses 84, 86. Additionally, a beamsplitter and lens may replace the partially transmissive mirror structure of the lens 84. Moreover, various other optical elements, such as polarizers, color filters, exit pupil expanders, chromatic correction elements, eye-tracking elements, and background masks may also be incorporated for certain applications.

Figure 7:
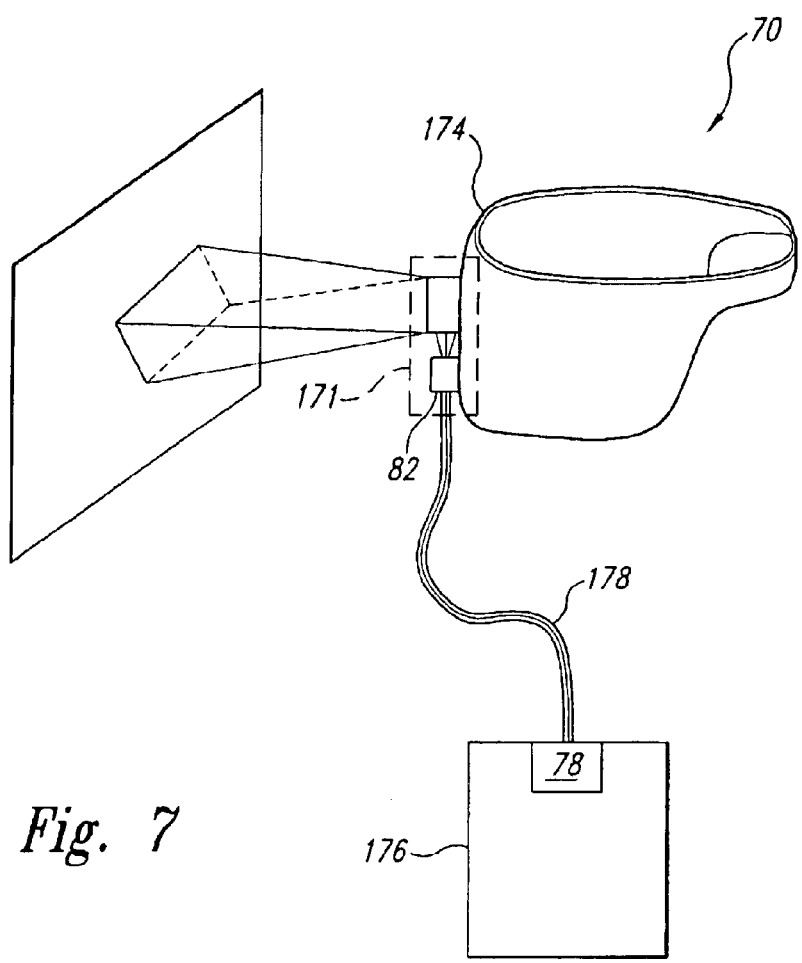
FIG. 7 is an isometric view of a head-mounted scanner including a tether.

Although the elements of FIG. 6 are presented diagrammatically, one skilled in the art will recognize that the components are typically sized and configured for the desired application. For example, where the display 70 is intended as a mobile personal display the components are sized and configured for mounting to a helmet or similar frame as a head-mounted display 70, as shown in FIG. 7. In this embodiment, a first portion 171 of the display 70 is mounted to a head-borne frame 174 and a second portion 176 is carried separately, for example in a hip belt. The portions 174, 176 are linked by a fiber optic and electronic tether 178 that carries optical and electronic signals from the second portion to the first portion. An example of a fiber-coupled scanner display is found in U.S. Pat. No. 5,596,339 of Furness et al., entitled VIRTUAL RETINAL DISPLAY WITH FIBER OPTIC POINT SOURCE which is incorporated herein by reference.

An exemplary embodiment of the scanning assembly 82 will be described next with reference to FIG. 8. The scanning assembly 82 includes several components that correspond to the scanning source 42 of FIG. 3, where components common to the scanning assembly 82 and scanning source 42 are numbered the same. Additionally, only central rays 55 are presented for the beams 52 for clarity of presentation.

Figure 3:
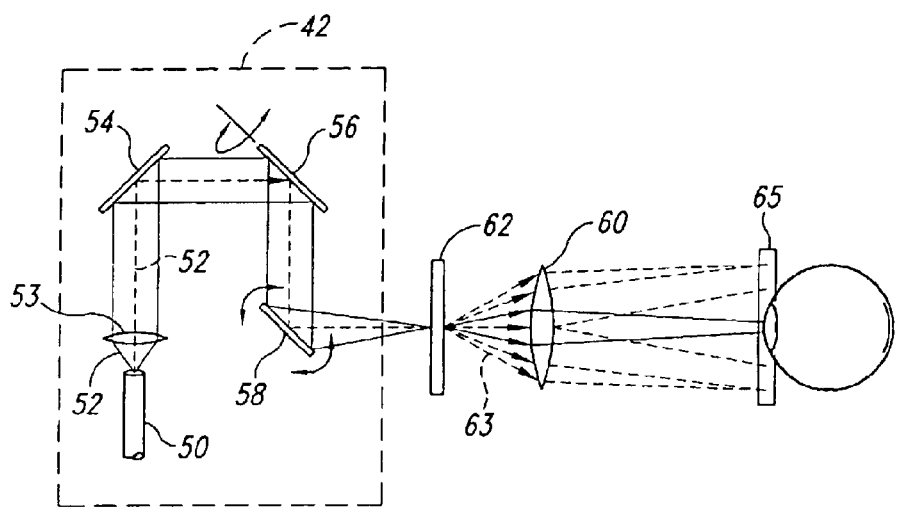
FIG. 3 is a diagrammatic representation of a scanner and a user's eye showing bi-directional scanning of a beam and coupling to the viewer's eye.
Figure 4A:
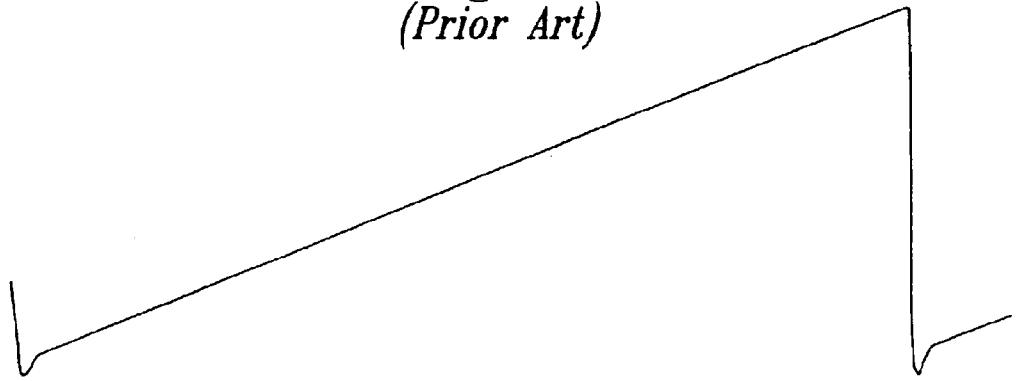
FIG. 4 is a signal-timing diagram of a scan pattern scanner in the scanning assembly of FIG. 3.
Figure 4B:
Figure 5:
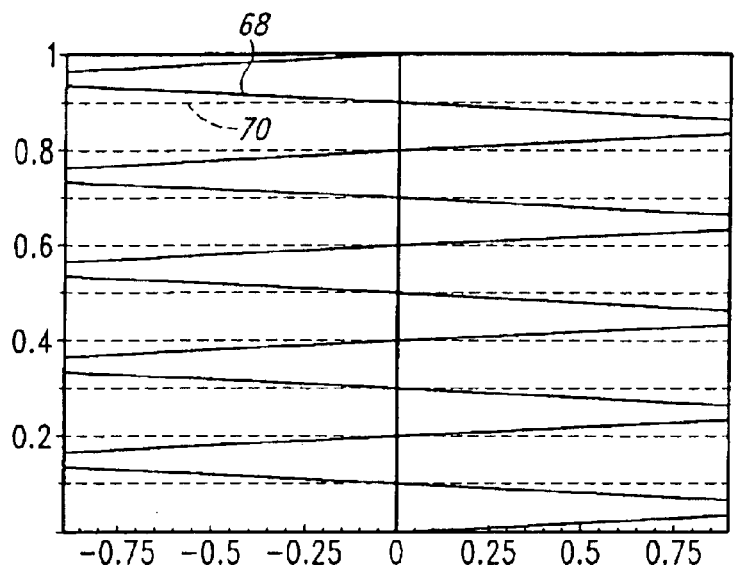
FIG. 5 is a signal position diagram showing the path followed by the scanned beam in response to the signals of FIG. 4, as compared to a desired raster scan path.

In this embodiment, a pair of fibers 50 emit light from the light sources 78 (not shown) and the lens 84 is represented as a common refractive lens rather than as a partially transmissive mirror. Unlike the scanning source 42 of FIG. 3, the scanning assembly 82 includes an active correction mirror 100 that can pivot to scan the light beam 80 along the vertical axis. As will be explained below, the correction mirror 100 produces a varying corrective shift along the vertical axis during each sweep (forward or reverse) of the horizontal scanner 56. The corrective shift offsets vertical movement of the beams 80 caused by the vertical scanner 58 to reduce the overall deviation of the scanning pattern from the desired pattern shown in broken lines in FIG. 5.

Before describing the effects of the correction mirror 100 and the relative timing of the various signals, exemplary embodiments of mechanically resonant scanner 200, 220 suitable for use as the horizontal scanner 56 and vertical scanner 58 will be described with reference to FIG. 9.

The principal scanning component of the horizontal scanner 200 is a moving mirror 202 mounted to a spring plate 204. The dimensions of the mirror 202 and spring plate 204 and the material properties of the spring plate 204 have a high Q with a natural oscillatory ("resonant") frequency on the order of 1–100 kHz, where the selected resonant frequency depends upon the application. For VGA quality output with a 60 Hz refresh rate and no interlacing, the resonant frequency is preferably about 15–20 kHz. As will be described below, the selected resonant frequency or the achievable resolution may be changed through the use of a plurality of feeds.

A ferromagnetic material mounted with the mirror 202 is driven by a pair of electromagnetic coils 206, 208 to provide motive force to mirror 202, thereby initiating and sustaining oscillation. The ferromagnetic material is preferably integral to the spring plate 204 and body of the mirror 202. Drive electronics 218 provide electrical signals to activate the coils 206, 208, as described above. Responsive to the electrical signals, the coils 206, 208 produce periodic electromagnetic fields that apply force to the ferromagnetic material, thereby causing oscillation of the mirror 202. If the frequency and phase of the electric signals are properly synchronized with the movement of the mirror 202, the mirror 202 oscillates at its resonant frequency with little power consumption.

The vertical scanner 220 is structured very similarly to the resonant scanner 200. Like the resonant scanner 201, the vertical scanner 220 includes a mirror 222 driven by a pair of coils 224, 226 in response to electrical signals from the drive electronics 218. However, because the rate of oscillation is much lower for vertical scanning, the vertical scanner 220 is typically not resonant. The mirror 222 receives light from the horizontal scanner 201 and produces vertical deflection at about 30–100 Hz. Advantageously, the lower frequency allows the mirror 222 to be significantly larger than the mirror 202, thereby reducing constraints on the positioning of the vertical scanner 220. The details of virtual retinal displays and mechanical resonant scanning are described in greater detail in U.S. Pat. No. 5,467,104, of Furness III, et al., entitled VIRTUAL RETINAL DISPLAY which is incorporated herein by reference.

One skilled in the art will recognize a variety of other structures that may scan a light beam through a generally raster pattern. For example, spinning polygons or galvanometric scanners may form either or both of the scanners 56, 58 in some applications.

In another embodiment, a bi-axial microelectromechanical (MEMs) scanner may provide the primary scanning. Such scanners are described in U.S. Pat. No. 5,629,790 to Neukermanns et al., entitled MICROMACHINED TOR- SIONAL SCANNER, which is incorporated herein by reference. Like the scanning system described above, the horizontal components of the MEMs scanners are typically defined by mechanical resonances of their respective structures, as will be described in greater detail below with reference to FIGS. 17A–B and 21. Like the two scanner system described above with reference to FIGS. 3 and 8, such biaxial scanners may suffer similar raster pinch problems due to movement along the slower scan axis during sweeps along the faster scan axis. Other scanning approaches may also apply. For example, acousto-optic scanners, electrooptic scanners, spinning polygons, or some combination of scanning approaches can provide the scanning function. Some of these approaches may not require pinch correction.

Returning to FIGS. 6, 8 and 9, the fibers 50 output light beams 80 that are modulated according to the image signal from the drive electronics 218. At the same time, the drive electronics 218 activate the coils 206, 208, 224, 226 to oscillate the mirrors 202, 222. The modulated beams of light strike the oscillating horizontal mirror 202 (of the horizontal scanner 56), and are deflected horizontally by an angle corresponding to the instantaneous angle of the mirror 202. The deflected beams then strike the vertical mirror 222 (of the vertical scanner 58) and are deflected at a vertical angle corresponding to the instantaneous angle of the vertical mirror 222. After expansion by the beam expander 62, the beams 52 pass through the lens 84 to the eye. As will also be described below, the modulation of the optical beams is synchronized with the horizontal and vertical scans so that, at each position of the mirrors, the beam color and intensity correspond to a desired virtual image. Each beam therefore "draws" a portion of the virtual image directly upon the user's retina.

Figure 9:
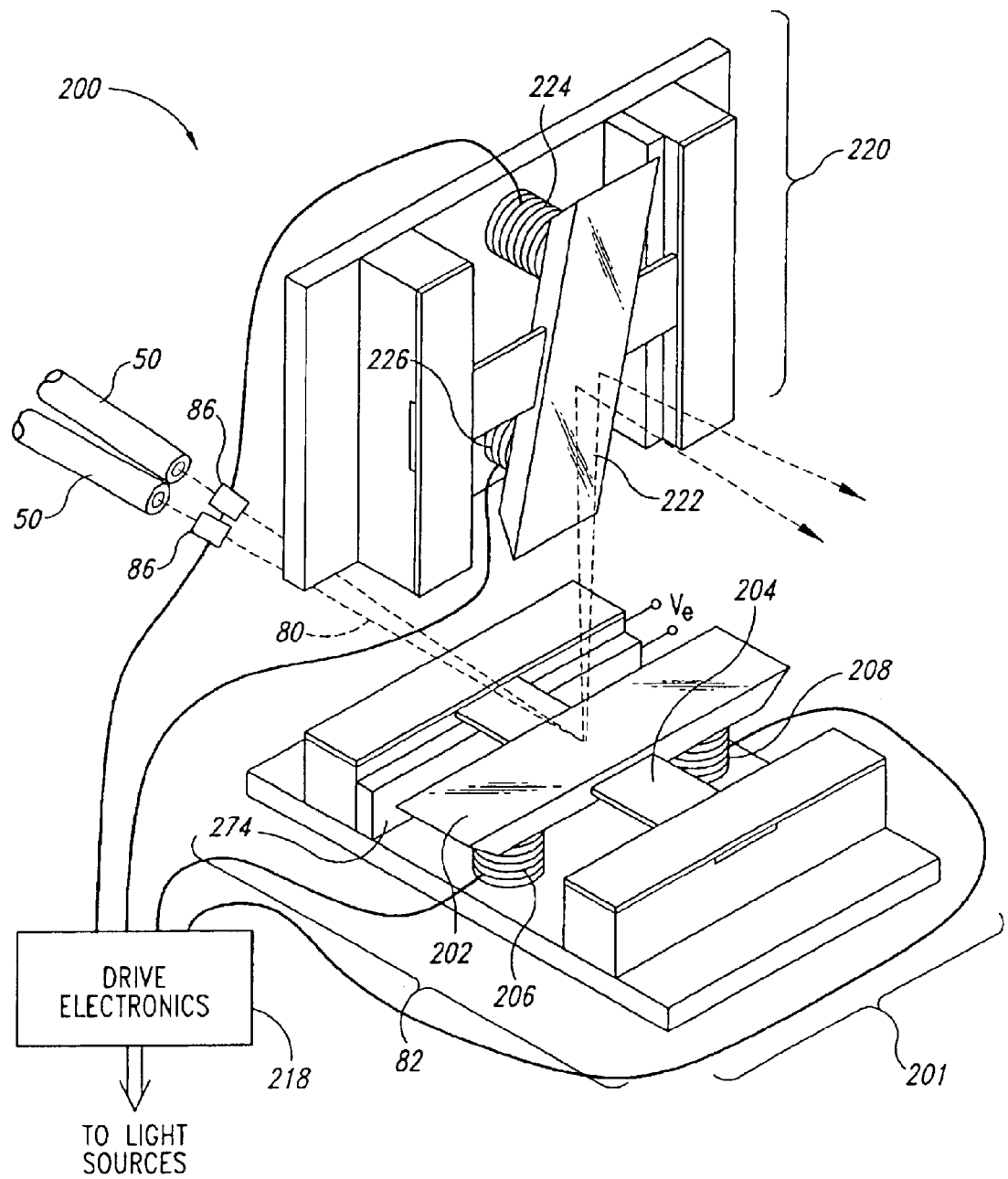
FIG. 9 is an isometric view of a horizontal scanner and a vertical scanner suitable for use in the scanning assembly of FIG. 8.

One skilled in the art will recognize that several components of the scanning assembly 82 have been omitted from the FIG. 9 for clarity of presentation. For example, the horizontal and vertical scanners 200, 220 are typically mounted to a frame. Additionally, lenses and other optical components for gathering, shaping, turning, focusing, or collimating the beams 80 have been omitted. Also, no relay optics are shown between the scanners 200, 220, although these may be desirable in some embodiments. Moreover, the scanner 200 typically includes one or more turning mirrors that direct the beam such that the beam strikes each of the mirrors a plurality of times to increase the angular range of scanning. Further, in some embodiments, the scanners 200, 220 are oriented such that the beam can strike the scanning mirrors a plurality of times without a turning mirror.

Figure 10:
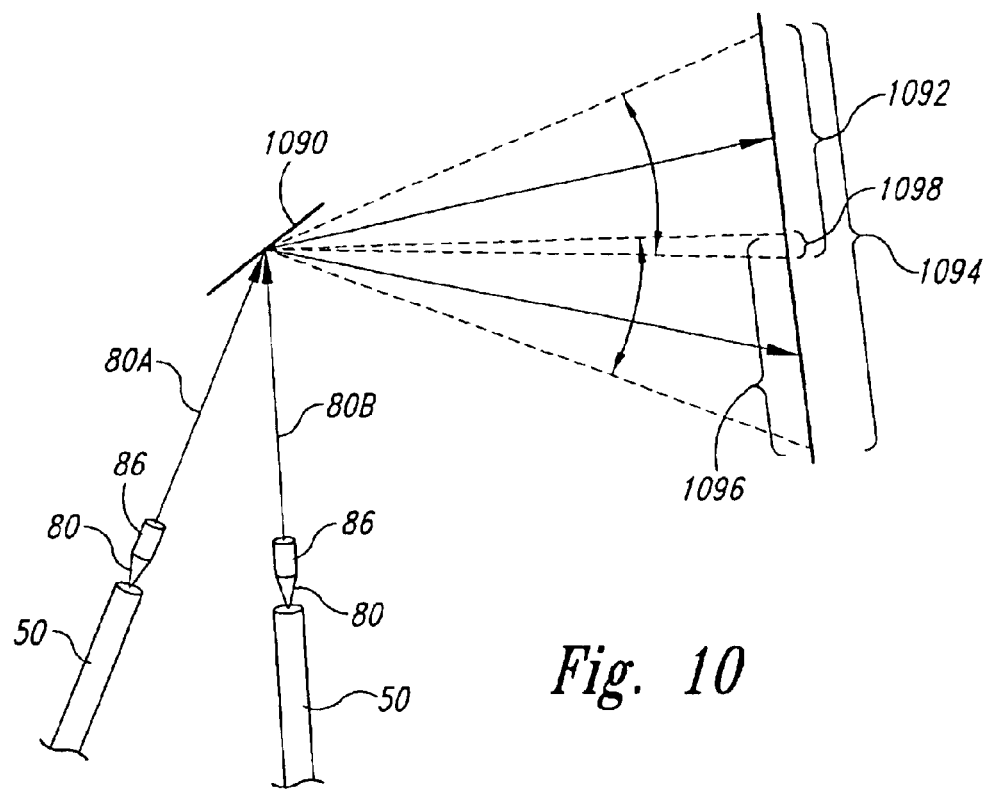
FIG. 10 is a diagrammatic representation of scanning with two input beams, showing slightly overlapped tiles.
Figure 11:
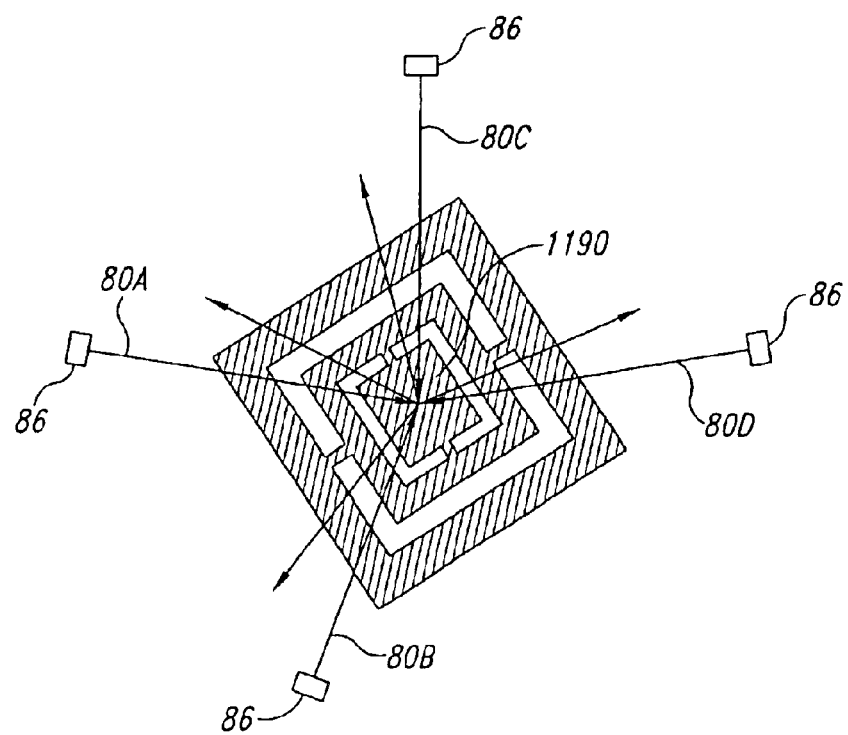
FIG. 11 is a top plan view of a biaxial scanner showing four feeds at spatially separated locations.

Turning to FIGS. 10 and 11, the effect of the plurality of beams 80 will now be described. As is visible in FIG. 10, two fibers 50 emit respective light beams 80. The GRIN lenses 86 gather and focus the beams 80 such that the beams 80 become converging beams 80A, 80B that strike a common scanning mirror 1090.

For clarity of presentation, the embodiment of FIG. 10 eliminates the mirror 84, as is desirable in some applications. Also, the embodiment of FIG. 10 includes a single mirror 1090 that scans biaxially instead of the dual mirror structure of FIG. 9. Such a biaxial structure is described in greater detail below with reference to FIGS. 11, 17A–B and 21. One skilled in the art will recognize that a dual mirror system may also be used, though such a system would typically involve a more complex set of ray traces and more complex compensation for differing optical path lengths.

Also, although the fibers 50 and lenses 84 of FIG. 10 appear positioned in a common plane with the scanning mirror 1090, in many applications, it may be desirable to position the fibers 50 and lenses 84 off-axis, as is visible in FIG. 11. Moreover, where four fiber/lens pairs are used, as in FIG. 11, a beam splitter or other optical elements can allow the fiber/lens pairs to be positioned where they do not block beams 80A–D from other fiber/lens pairs. Alternatively, other approaches, such as small turning mirrors can permit repositioning of the fiber/lens pairs in non-blocking positions with little effect on the image quality. Such approaches are described in greater detail below with reference to FIGS. 11 and 38–40.

After exiting the lens 86, the first beam 80A strikes the scanning mirror 1090 and is reflected toward an image field 1094. The second beam 80B is also reflected by the scanning mirror 1090 toward the image field 1094. As shown by the ray tracing of FIG. 10, the horizontal position of the beams 80A–B in the image field 1094 will be functions of the angular deflection from the horizontal scanner 56 and the position and orientation of the lens 86 and fiber 50.

At the image field 1092, the first beam 80A illuminates a first region 1092 of the image field 1094 and the second beam 80B illuminates a second region 1096 that is substantially non-overlapping with respect to the first region 1092. To allow a smooth transition between the two regions 1092, 1096, the two regions 1092, 1096 overlap slightly in a small overlap region 1098. Thus, although the two regions are substantially distinct, the corresponding image portions may be slightly "blended" at the edges, as will be described below with reference to FIGS. 12 and 13.

Figure 12:
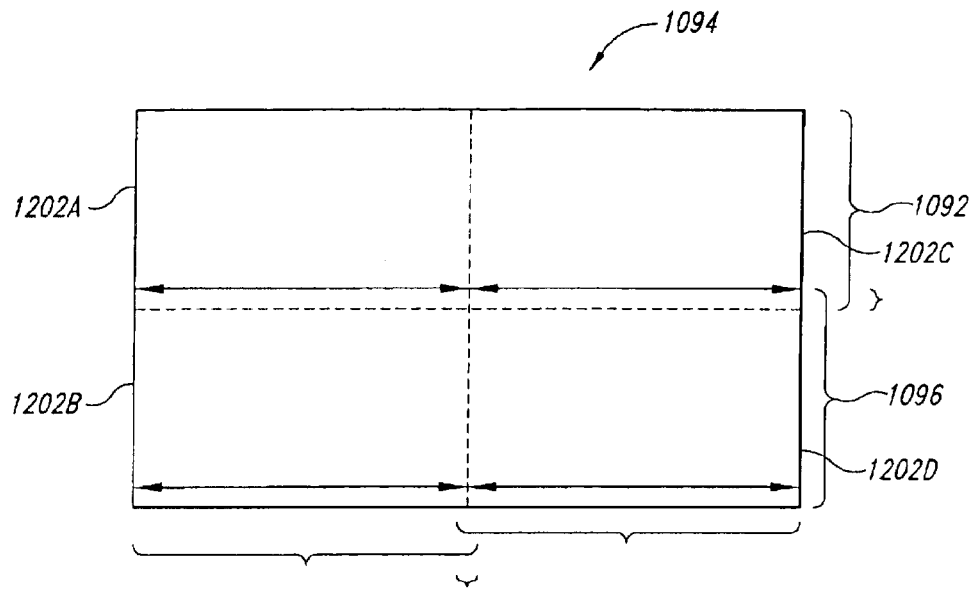
FIG. 12 is a diagrammatic representation of four tiles produces by the four feed scanner of FIG. 11.

While only two beams 80A–B are visible in FIG. 10, more than two fiber/lens pairs can be used and the fiber/lens pairs need not be coplanar. For example, as can be seen in FIG. 11, four separate lenses 86 transmit four separate beams 80A–D from four spatially separated locations toward the mirror 1090. As shown in FIG. 12, the mirror 1090 reflects each of the four beams 80A–D to a respective spatially distinct region 1202A–D of the image field 1094.

Thus, the four beams 80A–D each illuminate four separate "tiles" 1202A–D that together form an entire image. One skilled in the art will recognize that more than four tiles may form the image. For example, adding a third set of fiber/lens pairs could produce a 2-by-3 tile image or a 3-by-2 tile image.

Figure 13:
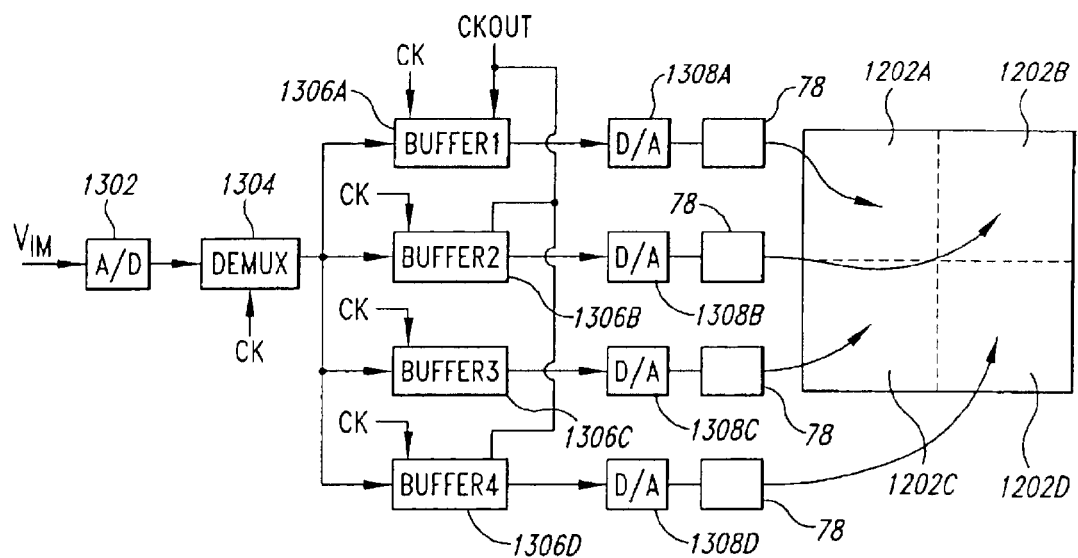
FIG. 13 is a schematic of a system for driving the four separate feeds of FIG. 11, including four separate buffers.

To produce an actual image, the intensity and color content of each of the beams 80A–D is modulated with image information as the mirror 1090 sweeps through a periodic pattern, such as a raster pattern. FIG. 13 shows diagrammatically one embodiment where the beams 80A–D can be modulated in response to an image signal $V_{IM}$ to produce the four tiles 1202A–D.

The image signal $V_{IM}$ drives an A/D converter 1302 that produces corresponding data to drive a demultiplexer 1304. In response to the data and a clock signal CK from the controller 74 (FIG. 8), the demultiplexer 1304 produces four output data streams, where each data stream includes data corresponding to a respective image tile 1202A–D. For example, the demultiplexer 1304 outputs data corresponding to the first half of the first line of the image to a first buffer 1306A and the data corresponding to the second half of the first line to a second buffer 1306B. The demultiplexer 1304 then outputs data corresponding to the second line of the image to the second lines of the first two buffers 1306A, B. After the first two buffers 1306A, B contain data representing the upper half of the image, the demultiplexer 1304 then begins filling third and fourth buffers 1306C, D. Once all of the buffers 1306A–D are full, an output clock CKOUT clocks data simultaneously from all of the buffers 1306A–D to respective D/A converters 1308A–D. The D/A converters 1308A–D then drive respective light sources 78 to produce light that is scanned into the respective regions 2102A–D, as described above. The actual timing of the pixel output is controlled by the output clock CKOUT, as described below with reference to FIGS. 28–31.

One skilled in the art will recognize that, although the system of FIG. 13 is described for four separate regions 1201A–D, a larger or smaller number of regions may be used. Also, where some overlap of the regions 1202A–D is desired, common data can be stored in more than one buffer 1202A–D. Because the sets of common data will duplicate some pixels in the overlapping region, the data may be scaled to limit the intensity to the desired level.

One approach to improving image quality that is helpful in "matching" the image portions 1202A–D to each other will now be described with reference to FIGS. 14 and 15. Because the angle of the beams 80A–D is determined by the angles of the vertical and horizontal scanner (for the uniaxial, two scanner system) or the horizontal and vertical angles of the single mirror (for the biaxial scanner), the actual vector angle of the beams 80A–D at any point in time can then be determined by vector addition. In most cases, the desired vertical portions of the scan patterns will be a "stair step" scan pattern, as shown by the broken line in FIG. 14.

If the turning mirror 100 (FIG. 8) is disabled, the pattern traced by the ray will be the same as that described above with respect to FIGS. 3–5. As represented by the solid line in FIG. 14, the actual vertical scan portion of the pattern, shown in solid line, will be an approximate ramp, rather than the desired stair step pattern.

On approach to providing the stair step pattern would be to drive the vertical scanner 58 with the stair step voltage. However, because the vertical mirror is a physical system and the stair step involves discontinuous motion, the vertical mirror will not follow the drive signal exactly. Instead, as the vertical mirror attempts to follow the stair step pattern, the vertical mirror will move at a maximum rate indicated largely by the size and weight of the vertical mirror, the material properties of the mirror support structure, the peak voltage or current of the driving signal, and electrical properties of the driving circuitry. For typical vertical scan mirror size, configuration, scan angle and driving voltage, the vertical scanner 58 is limited to frequencies on the order of 100 to 3000 Hz. The desired scan pattern has frequency components far exceeding this range. Consequently, driving the vertical scanner 58 with a stair step driving signal can produce a vertical scan pattern that deviates significantly from the desired pattern.

Figure 8:
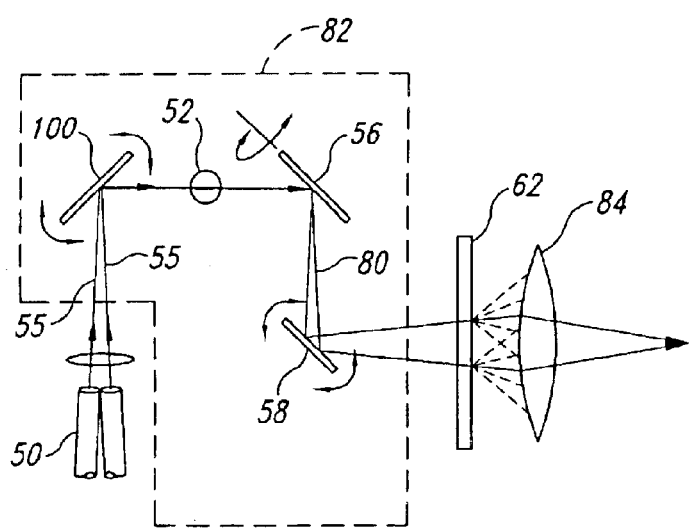
FIG. 8 is a diagrammatic representation of a scanning assembly within the scanning display of FIG. 6, including a correction mirror.

To reduce this problem, the scanning assembly 82 of FIG. 8 separates the vertical scan function into two parts. The overall vertical scan is then a combination of a large amplitude ramp function at about 60 Hz and a small amplitude correction function at twice the horizontal rate (e.g., about 30 kHz). The vertical scanner 58 can produce the large amplitude ramp function, because the 60 Hz frequency is well below the upper frequency limit of typical scanning mirrors. Correction mirrors 100 replace the turning mirrors 100 and provide the small amplitude corrections. The correction mirrors 100 operate at a much higher frequency than the vertical scanner; however, the overall angular swings of the correction mirrors 100 are very small.

Figure 14:
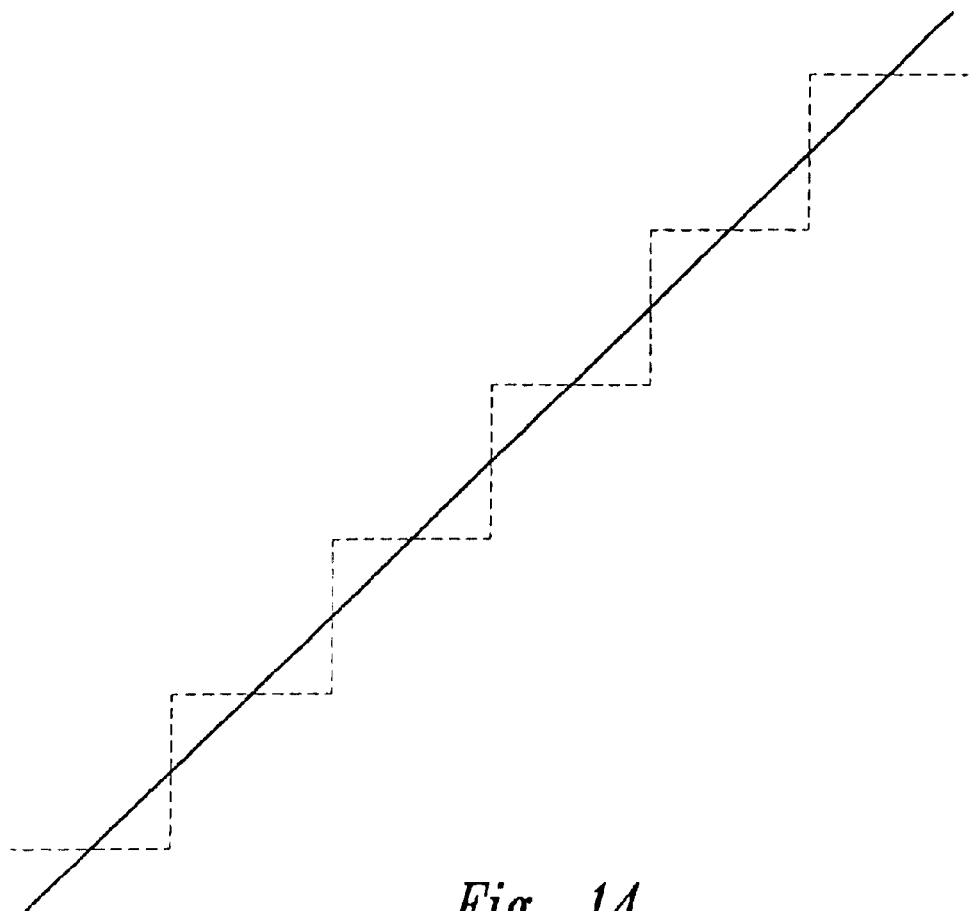
FIG. 14 is a signal-timing diagram comparing a ramp signal with a desired signal for driving the vertical scanner.
Figure 15:
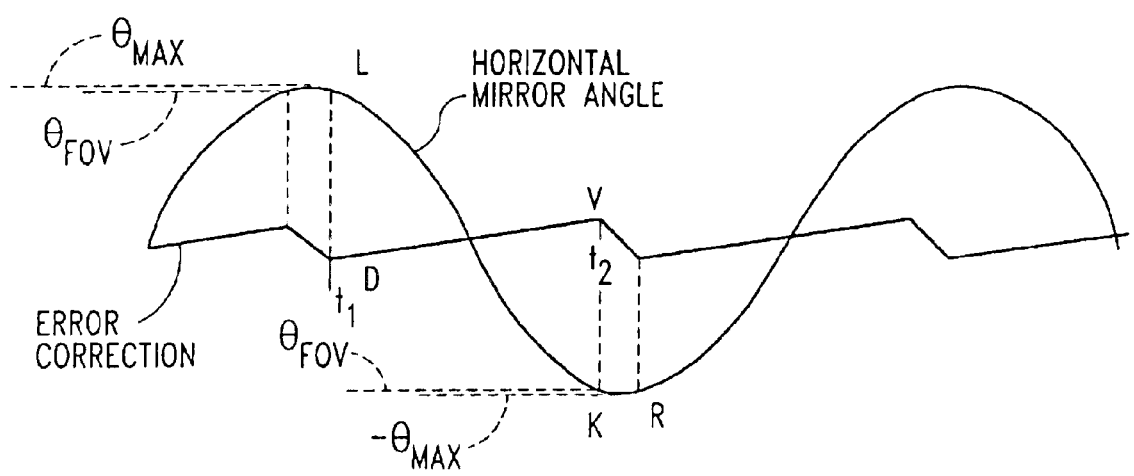
FIG. 15 is a signal timing diagram showing positioning error and correction for the vertical scanning position.

As can be seen from the signal timing diagram of FIG. 15, the correction mirror 100 travels from approximately its maximum negative angle to its maximum positive angle during the time that the horizontal scanner scans from the one edge of the field of view to the opposite edge (i.e. from time $t_1$ to $t_2$ in FIG. 15). The overall correction angle, as shown in FIGS. 14 and 15, is defined by the amount of downward travel of the vertical scan mirror during a single horizontal scan. The correction angle will vary for various configurations of the display; however, the correction angle can be calculated easily.

For example, for a display where each image region 1202A–D has 1280 vertical lines and a total mechanical vertical scan angle of 10 degrees, the angular scan range for each line is about 0.008 degrees (10/1280=0.0078125). Assuming the vertical scanner 58 travels this entire distance during the horizontal scan, an error correction to be supplied by the correction mirror 100 is about plus or minus 0.0039 degrees. The angular correction is thus approximately $\theta/N$, where $\theta$ is the vertical scan angle and N is the number of horizontal lines. This number may be modified in some embodiments. For example, where the horizontal scanner 56 is a resonant scanner, the correction angle may be slightly different, because the horizontal scanner 56 will use some portion of the scan time to halt and begin travel in the reverse direction, as the scan reaches the edge of the field of view. The correction angle may also be modified to correct for aberrations in optical elements or optical path length differences. Moreover, the frequency of the correction scanner 100 may be reduced by half if data is provided only during one half of the horizontal scanner period ("unidirectional scanning"), although raster pinch is typically not problematic in unidirectional scanning approaches.

As can be seen from the timing diagrams of FIGS. 14 and 15, the correction mirror 100 will translate the beam vertically by about one half of one line width at a frequency of twice that of the horizontal scanner 56. For a typical display at SVGA image quality with bidirectional scanning (i.e., data output on both the forward and reverse sweeps of the horizontal scanner 56), the horizontal scanner 56 will resonate at about 15 kHz. Thus, for a typical display, the correction scanner 100 will pivot by about one-tenth of one degree at about 30 kHz. One skilled in the art will recognize that, as the resolution of the display increases, the scan rate of the horizontal scanner 56 increases. The scan rate of the correction mirror 100 will increase accordingly; but, the pivot angle will decrease. For example, for a display having 2560 lines and an overall scan of 10 degrees, the scan rate of the correction mirror 100 will be about 60 kHz with a pivot angle of about 0.002 degrees. One skilled in the art will recognize that, for higher resolution, the minimum correction mirror size will typically increase where the spot size is diffraction limited.

Figure 16:
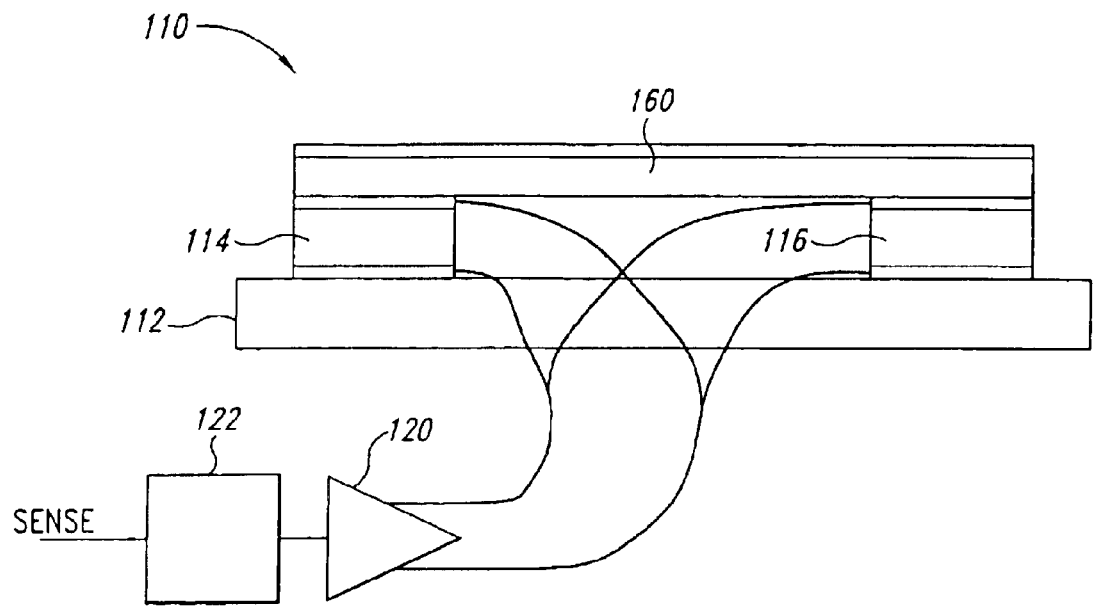
FIG. 16 is a side cross sectional view of a piezoelectric correction scanner.

FIG. 16 shows a piezoelectric scanner 110 suitable for the correction mirror 100 in some embodiments. The scanner 110 is formed from a platform 112 that carries a pair of spaced-apart piezoelectric actuators 114, 116. The correction mirror 100 is a metallized, substantially planar silicon substrate that extends between the actuators 114, 116. The opposite sides of the piezoelectric actuators 114, 116 are conductively coated and coupled to a drive amplifier 120 such that the voltage across the actuators 114, 116 are opposite. As is known, piezoelectric materials deform in the presence of electric fields. Consequently, when the drive amplifier 120 outputs a voltage, the actuators 114, 116 apply forces in opposite directions to the correction mirror 100, thereby causing the correction mirror 100 to pivot. One skilled in the art will recognize that, although the piezoelectric actuators 114, 116 are presented as having a single set of electrodes and a single layer of piezoelectric material, the actuators 114, 116 would typically be formed from several layers. Such structures are used in commercially available piezoelectric devices to produce relatively large deformations.

A simple signal generator circuit 122, such as a conventional ramp generator circuit, provides the driving signal for the drive amplifier 120 in response to the detected position of the horizontal scanner 56. The principal input to the circuit 122 is a sense signal from a sensor coupled to the horizontal scanner 56. The sense signal can be obtained in a variety of approaches. For example, as described in U.S. Pat. No. 5,648,618 to Neukermanns et al., entitled MICROMACHINED HINGE HAVING AN INTEGRAL TORSIONAL SENSOR, which is incorporated herein by reference, torsional movement of a MEMs scanner can produce electrical outputs corresponding to the position of the scanning mirror. Alternatively, the position of the mirror may be obtained by mounting piezoelectric sensors to the scanner, as described in U.S. Pat. No. 5,694,237 to Melville, entitled POSITION DETECTION OF MECHANICAL RESONANT SCANNER MIRROR, which is incorporated herein by reference. In other alternatives, the position of the beam can be determined by optically or electrically monitoring the position of the horizontal or vertical scanning mirrors or by monitoring current induced in the mirror drive coils.

When the sense signal indicates that the horizontal scanner 56 is at the edge of the field of view, the circuit 122 generates a ramp signal that begins at its negative maximum and reaches its zero crossing point when the horizontal scanner reaches the middle of the field of view. The ramp signal then reaches its maximum value when the horizontal scan reaches the opposite edge of the field of view. The ramp signal returns to its negative maximum during the interval when the horizontal scan slows to a halt and begins to return sweep. Because the circuit 122 can use the sense signal as the basic clock signal for the ramp signal, timing of the ramp signal is inherently synchronized to the horizontal position of the scan. However, one skilled in the art will recognize that, for some embodiments, a controlled phase shift of the ramp signal relative to the sense signal may optimize performance. Where the correction mirror 100 is scanned resonantly, as described below with reference to FIG. 18, the ramp signal can be replaced by a sinusoidal signal, that can be obtained simply be frequency doubling, amplifying and phase shifting the sense signal.

The vertical movements of the beams 80A–D induced by the correction mirrors 100 offset the movement of the beams 80A–D caused by the vertical scanner 58, so that the beams 80A–D remain stationary along the vertical axis during the horizontal scan. During the time the horizontal scan is out of the field of view, the beams 80A–D travel vertically in response to the correction mirrors 100 to the nominal positions of the next horizontal scan.

Figure 17A:
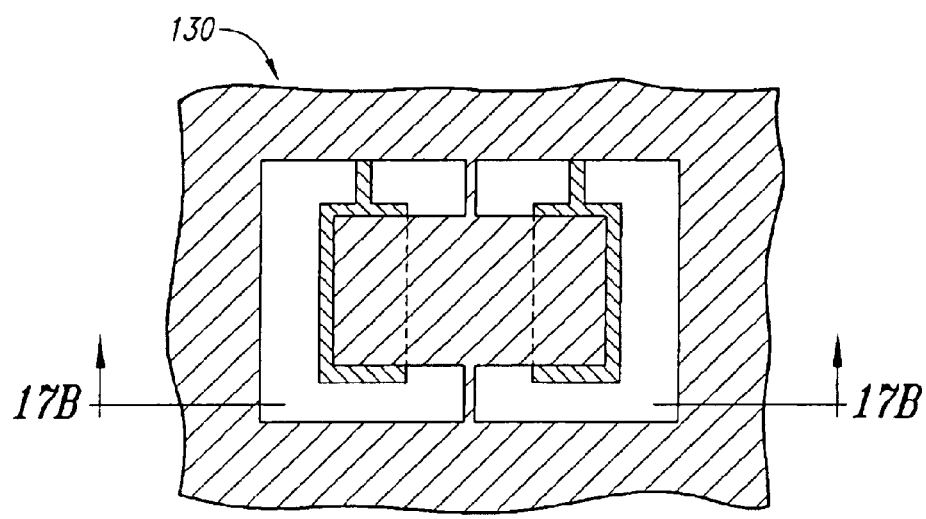
FIG. 17A is a top plan view of a microelectromechanical (MEMs) correction scanner.
Figure 17B:
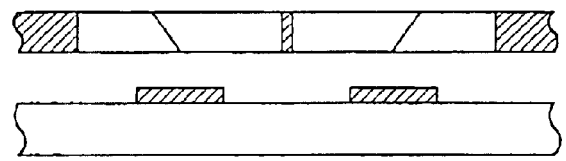
FIG. 17B is a side cross-sectional view of the MEMs correction scanner of FIG. 17A showing capacitive plates and their alignment to the scanning mirror.

As can be seen from the above discussion, the addition of the piezoelectrically driven correction mirrors 100 can reduce the raster pinching significantly with a ramp-type of motion. However, in some applications, it may be undesirable to utilize ramp-type motion. One alternative embodiment of a scanner 130 that can be used for the correction mirror 100 is shown in FIGS. 17A and 17B.

The scanner 130 is a resonant micorelectromechanical (MEMs) scanner, fabricated similarly to the uniaxial embodiment described in the Neukermanns '790 patent. Alternatively, the scanner 130 can be a mechanically resonant scanner very similar to the horizontal scanner 54 of FIG. 9; however, in such a scanner it is preferred that the dimensions and material properties of the plate and mirror be selected to produce resonance at about 30 kHz, which is twice the resonant frequency of the horizontal scanner 200. Further, the materials and mounting are preferably selected so that the scanner 130 has a lower Q than the Q of the horizontal scanner 56. The lower Q allows the scanner 130 to operate over a broader range of frequencies, so that the scanner 130 can be tuned to an integral multiple of the horizontal scan frequency.

The use of the resonant scanner 130 can reduce the complexity of the electrical components for driving the scanner 130 and can improve the scanning efficiency relative to previously described approaches. Resonant scanners tend to have a sinusoidal motion, rather than the desired ramp-type motion described above. However, if the frequency, phase, and amplitude of the sinusoidal motion are selected appropriately, the correction mirror 100 can reduce the pinch error significantly. For example, FIG. 18 shows correction of the raster signal with a sinusoidal motion of the correction mirror where the horizontal field of view encompasses 90 percent of the overall horizontal scan angle. One skilled in the art will recognize that the error in position of the beam can be reduced further if the field of view is a smaller percentage of the overall horizontal scan angle. Moreover, even further reductions in the scan error can be realized by adding a second correction mirror in the beam path, although this is generally undesirable due to the limited improvement versus cost. Another approach to reducing the error is to add one or more higher order harmonics to the scanner drive signal so that the scanning pattern of the resonant correction scanner 130 shifts from a sinusoidal scan closer to a sawtooth wave.

Another alternative embodiment of a reduced error scanner 140 is shown in FIG. 19 where the scan correction is realized by adding a vertical component to a horizontal mirror 141. In this embodiment, the horizontal scanner 140 is a MEMs scanner having an electrostatic drive to pivot the scan mirror. The horizontal scanner 140 includes an array of locations 143 at which small masses 145 may be formed. The masses 145 may be deposited metal or other material that is formed in a conventional manner, such as photolithography. Selected ones of the masses 143 are removed to form an asymmetric distribution about a centerline 147 of the mirror 141. The masses 145 provide a component to scan the correction along the vertical axis by pivoting about an axis orthogonal to its primary axis. As can be seen in FIG. 20, the vertical scan frequency is double the horizontal scan frequency, thereby producing the Lissajous or "bow-tie" overall scan pattern of FIG. 20. The masses 145 may be actively varied (e.g. by laser ablation) to tune the resonant frequency of the vertical component. This embodiment allows correction without an additional mirror, but typically requires matching the resonant frequencies of the vibration and the horizontal scanner.

To maintain matching of the relative resonant frequencies of the horizontal scanner 56 and the correction scanner 100, the resonant frequency of either or both scanners 56, 100 may be tuned actively. Various frequency control techniques are described below with reference to FIGS. 33–36. Where the Q of the scanners 56, 100 are sufficiently low or where the scanners 56, 100 are not resonant, simply varying the driving frequency may shift the scanning frequency sufficiently to maintain synchronization.

Figure 21:
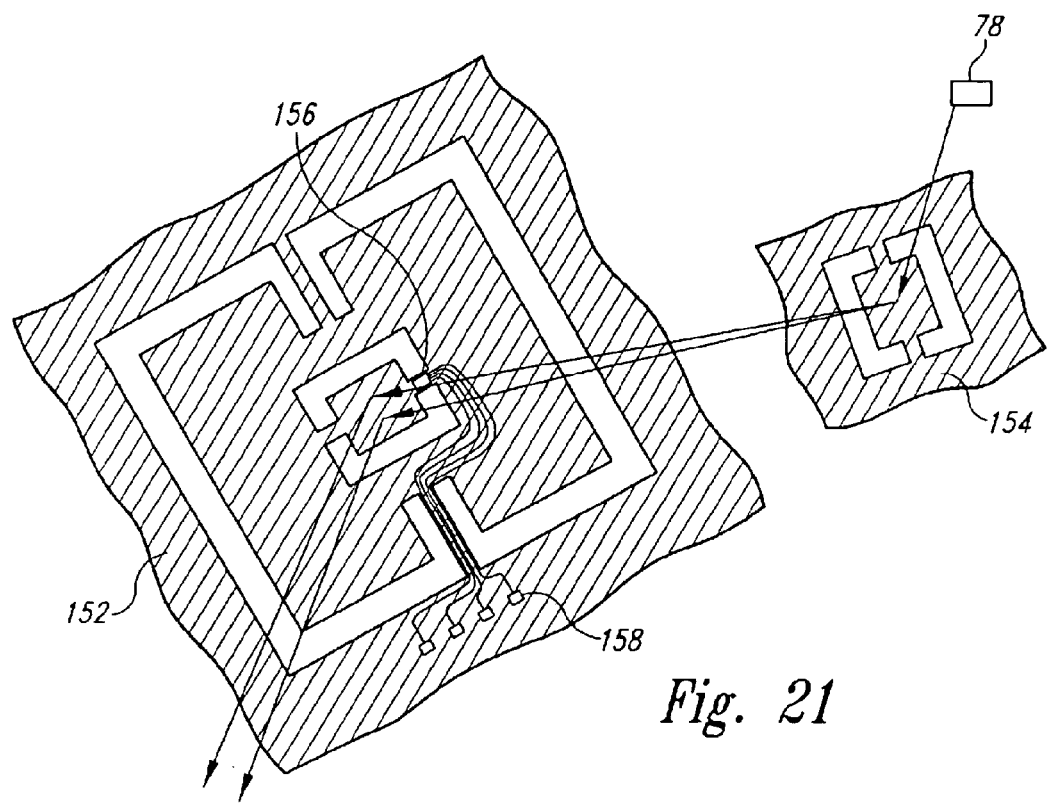
FIG. 21 is a diagrammatic view of a scanning system, including a biaxial microelectromechanical (MEMs) scanner and a MEMs correction scanner.

As shown in FIG. 21, another embodiment of a scanner 150 according to the invention employs a biaxial scanner 152 as the principal scan component, along with a correction scanner 154. The biaxial scanner 152 is a single mirror device that oscillates about two orthogonal axes. Design, fabrication and operation of such scanners are described for example in the Neukermanns '790 patent, in Asada, et al, Silicon Micromachined Two-Dimensional Galvano Optical Scanner, IEEE Transactions on Magnetics, Vol. 30, No. 6, 4647–4649, November 1994, and in Kiang et al, Micromachined Microscanners for Optical Scanning, SPIE proceedings on Miniaturized Systems with Micro-Optics and Micromachines II, Vol. 3008, February 1997, pp. 82–90 each of which is incorporated herein by reference. The bi-axial scanner 152 includes integral sensors 156 that provide electrical feedback of the mirror position to terminals 158, as is described in the Neukermanns '618 patent.

The correction scanner 154 is preferably a MEMs scanner such as that described above with reference to FIGS. 17A–B, although other types of scanners, such as piezoelectric scanners may also be within the scope of the invention. As described above, the correction mirror 154 can scan sinusoidally to remove a significant portion of the scan error; or, the correction mirror can scan in a ramp pattern for more precise error correction.

Light from the light source 78 strikes the correction mirror 154 and is deflected by a correction angle as described above. The light then strikes the biaxial scanner 152 and is scanned horizontally and vertically to approximate a raster pattern, as described above with reference to FIGS. 3–5.

Figure 22:
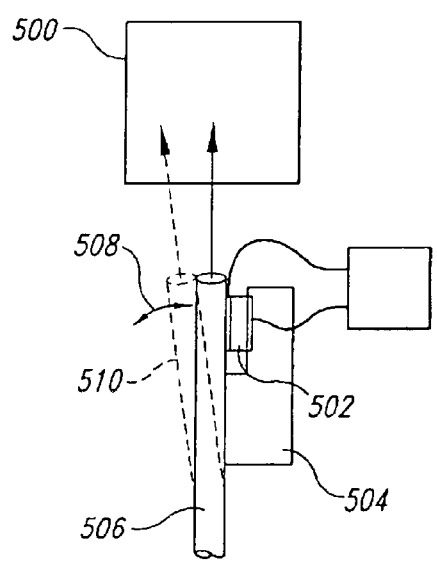
FIG. 22 is a diagrammatic view of a correction scanner that shifts an input beam by shifting the position or angle of the input fiber.

Another embodiment of a display according to the invention, shown in FIG. 22, eliminates the correction mirror 100 by physically shifting the input beam laterally relative to the input of an optical system 500. In the embodiment of FIG. 22, a piezoelectric driver 502 positioned between a frame 504 and an input fiber 506 receives a drive voltage at a frequency twice that of the horizontal scan frequency. Responsive to the drive voltage, the piezoelectric driver 502 deforms. Because the fiber 506 is bonded to the piezoelectric driver 502, deformation of the piezoelectric driver 502 produces corresponding shifting of the fiber 506 as indicated by the arrow 508 and shadowed fiber 510. One skilled in the art will recognize that, depending upon the characteristics of the optical system 500, the piezoelectric driver 502 may produce lateral translation of the fiber 506 or angular shifting of the fiber 506 output. The optical system 500 then translates movement of the fiber output into movement of the perceived pixel location as in the previously described embodiments. While the embodiment of FIG. 23 translates a fiber, the invention is not so limited. For example some applications may incorporate translation of other sources, such as LEDs or laser diodes, may translate the position of the lens 50, or may translate or rotate an entire scanner, such as a biaxial MEMs scanner.

Figure 23:
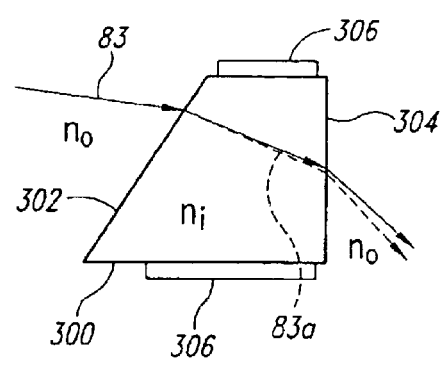
FIG. 23 is a diagrammatic view of a correction scanner that includes an electro-optic crystal that shifts the input beam in response to an electrical signal.

Although the embodiment of FIG. 22 shifts the input beam by shifting the position of the input fiber, other methods of shifting the input beam may be within the scope of the invention. For example, as shown in FIG. 23, an electro-optic crystal 300 shifts the input beam 83 in response to an electrical signal. In this embodiment, the beam 83 enters a first face 302 of a trapezoidally shaped electro-optic crystal 300, where refraction causes a shift in the direction of propagation. When the beam 83 exits through a second face 304, refraction produces a second shift in the direction of propagation. At each face, the amount of changes in the direction or propagation will depend upon difference in index of refraction between the air and the crystal 300.

As is known, the index of refraction of electro-optical crystals is dependent upon the electric field through the crystal. A voltage applied across the crystal 300 through a pair of electrodes 306 can control the index of refraction of the crystal 300. Thus, the applied voltage can control the index of refraction of the crystal 300. Thus the applied voltage can control the angular shift of the beam 83 as it enters and exits the crystal 300 as indicated by the broken line 83a. The amount of shift will correspond to the applied voltage. Accordingly, the amount of shift can be controlled by controlling the voltage applied to the electrodes 306. The crystal 300 thus provides a voltage controlled beam shifter that can offset raster pinch.

Figure 24:
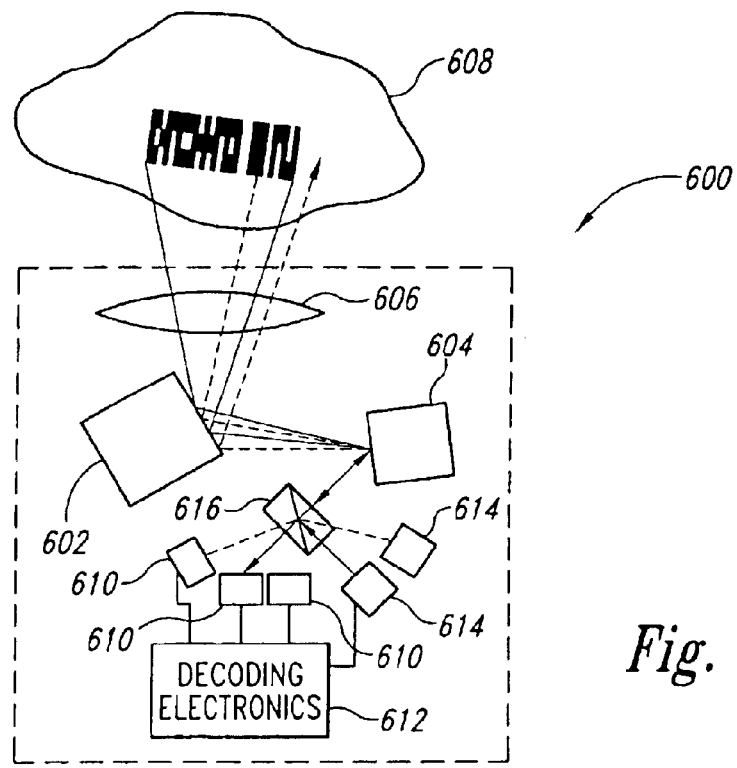
FIG. 24 is a diagrammatic view of an imager that acquires external light from a target object.

Although the embodiments described herein have been displays, other devices or methods may be within the scope of the invention. For example, as shown in FIG. 24, an imager 600 includes a biaxial scanner 602 and correction scanner 604 that are very similar to the scanners 152, 154 of FIG. 21. The imager 600 is an image collecting device that may be the input element of a digital camera, bar code reader, two dimensional symbol reader, document scanner, or other image acquisition device. To allow the imager 600 to gather light efficiently, the imager 600 includes gathering optics 606 that collect and transmit light from a target object 608 outside of the imager 600 onto the correction scanner 604. The gathering optics 606 are configured to have a depth of field, focal length, field of view and other optical characteristics appropriate for the particular application. For example, where the imager 600 is a two dimensional symbology reader, the gathering optics 606 may be optimized for red or infrared light and the focal length may be on the order of 10–50 cm. For reading symbols at a greater distance, the focusing optics may have longer focusing distance or may have a variable focus. The optics may be positioned at other locations along the optical path to allow smaller, cheaper components to be used.

The correction scanner 604 redirects light received from the gathering optics 606 as described above for the display embodiments, so that the gathered light has a correction component before it reaches the biaxial scanner 602. The biaxial scanner 602 scans through a generally raster pattern to collect light arriving at the gathering optics 606 from a range of angles and to redirect the light onto a group of stationary photodetectors 610, each positioned at a respective location and orientation, such that it images a respective "tile" of the image field.

Movement of the biaxial scanner 602 thus translates to imaging successive points of the target object 608 onto the photodetectors 610. The photodetectors 610 convert light energy from the scanner 602 into electrical signals that are received by decoding electronics 612. Where the imager 600 is a symbology reader, the decoding electronics 612 may include symbol decoding and storing circuitry and further electronics for assembling the image form the stored files. Where the imager is a portion of a camera, the decoding electronics 612 may include digital-to-analog converters, memory devices and associated electronics for storing a digital representation of the scanned tile and further electronics for assembling the image from the stored files. One skilled in the art will recognize that, although the correction scanner 604 is positioned before the bi-axial scanner 602, it may be desirable to position the correction scanner 604 following the bi-axial scanner 602 in some applications.

Another feature of the imager 600 shown in FIG. 24 is a set of illumination sources 614 that provide light for illuminating respective locations on a target object. The illumination sources 614 are preferably of different wavelengths to ease differentiation of beams, although in some applications common wavelength devices may be used. In one example of a multiwavelength structure where imager 600 is a symbol reader, the illumination sources 614 may include infrared or red light emitters that emit beams of light into a beam splitter 616. The beam splitter 616 directs the illuminating light beams into the biaxial scanner 602 where the illuminating light is redirected to the correction scanner 604. Because the illuminating light beams are collinear with the paths of light from the target object 608, the illuminating light beams strike the target object 608 at the same locations that are imaged by the photodetectors 610. The illuminating light beams are reflected by the target object 608 in pattern corresponding to the reflectivity of the respective regions of the target object 608. The reflected illuminating light travels to the photodetectors 610 to image the respective regions light that can be used only by the photodetectors 610 to image the respective regions of the target object 608. For high resolution, the area illuminated by the sources 614 or imaged by the photodetectors 610 may be made small through a variety of known optical techniques. One skilled in the art will recognize that, although FIG. 24 shows the correction scanner 604 positioned after the horizontal scanner 602, it will often be preferable to position the correction scanner 604 between the beam splitter 616 and the horizontal scanner 602. This allows for the mirror of the correction scanner 604 to be made small.

Alternatively, the photodetectors 610 may be mounted externally to the scanners 602, 604 and oriented to capture light directly from their respective tiles. Because each photodetector 610 is wavelength matched to its respective source and because the photodetectors 610 are aligned to spatially distinct regions, crosstalk between signals from the respective tiles may be adequately suppressed.

Figure 25:
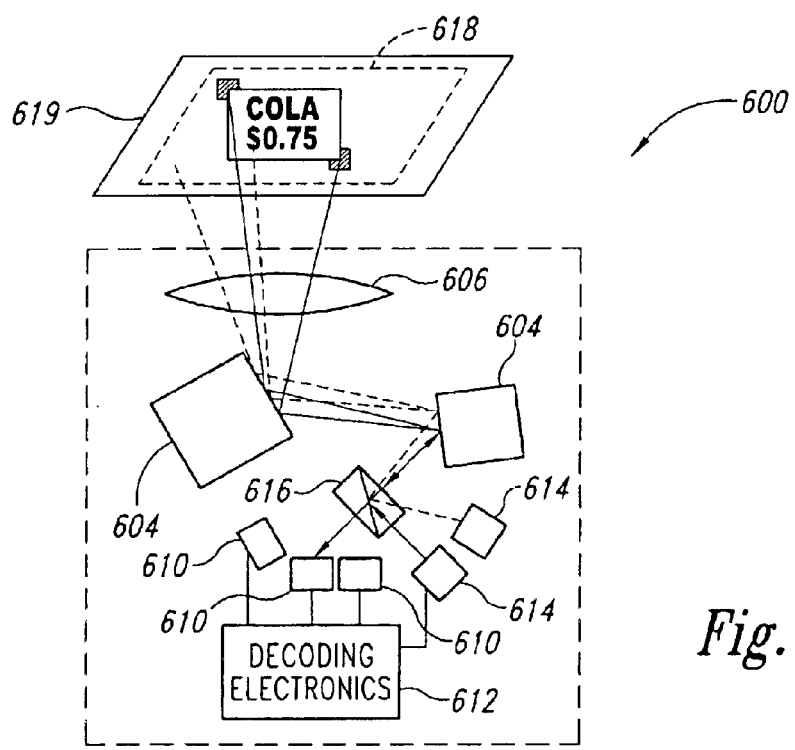
FIG. 25 is a diagrammatic view of an alternative embodiment of the imager of FIG. 24 that also projects a visible image.

In one application of the imager 600 of FIG. 24, one or more of the illumination sources 614 includes a visible, directly modulated light source, such as a red laser diode or a visible wavelength light emitted diode (LED). As shown in FIG. 25, the visible illumination source 614 can thus produce a visible image for the user. In the exemplary embodiment of FIG. 25, the imager can operate as a symbology scanner to identify information contained in a symbol on the target object 608. Once the decoding electronics 612 identifies a desired image to be viewed, such as an item price and identity, the decoding electronics 612 modulates the drive current of the illumination sources 614 to modulate the intensity of the emitted light according to the desired image. When the user directs the imager 600 toward a screen 619 (or the target object), the illuminating light is scanned onto the screen 619 as described above. Because the illuminating light is modulated according to the desired image, the visible light reflected from the screen 619 is spatially modulated according to the desired image. The imager 600 thus acts as an image projector in addition to acquiring image data. In addition to, or as an alternative to, modulating the diode to produce an image, the diodes corresponding to each of the regions of the target object 608 may also output continuous or pulsed beams of light that fill the entire field of view of the imager 600. The imager 600 thus provides a spotter frame 618 that indicates the field of view to the user. Similarly, the illumination sources 614 can be modified to outline the field of view or to produce other indicia of the field of view, such as cross hatching or fiducials, to aid the user in aligning the imager 600 to the target object 608.

Figure 28:
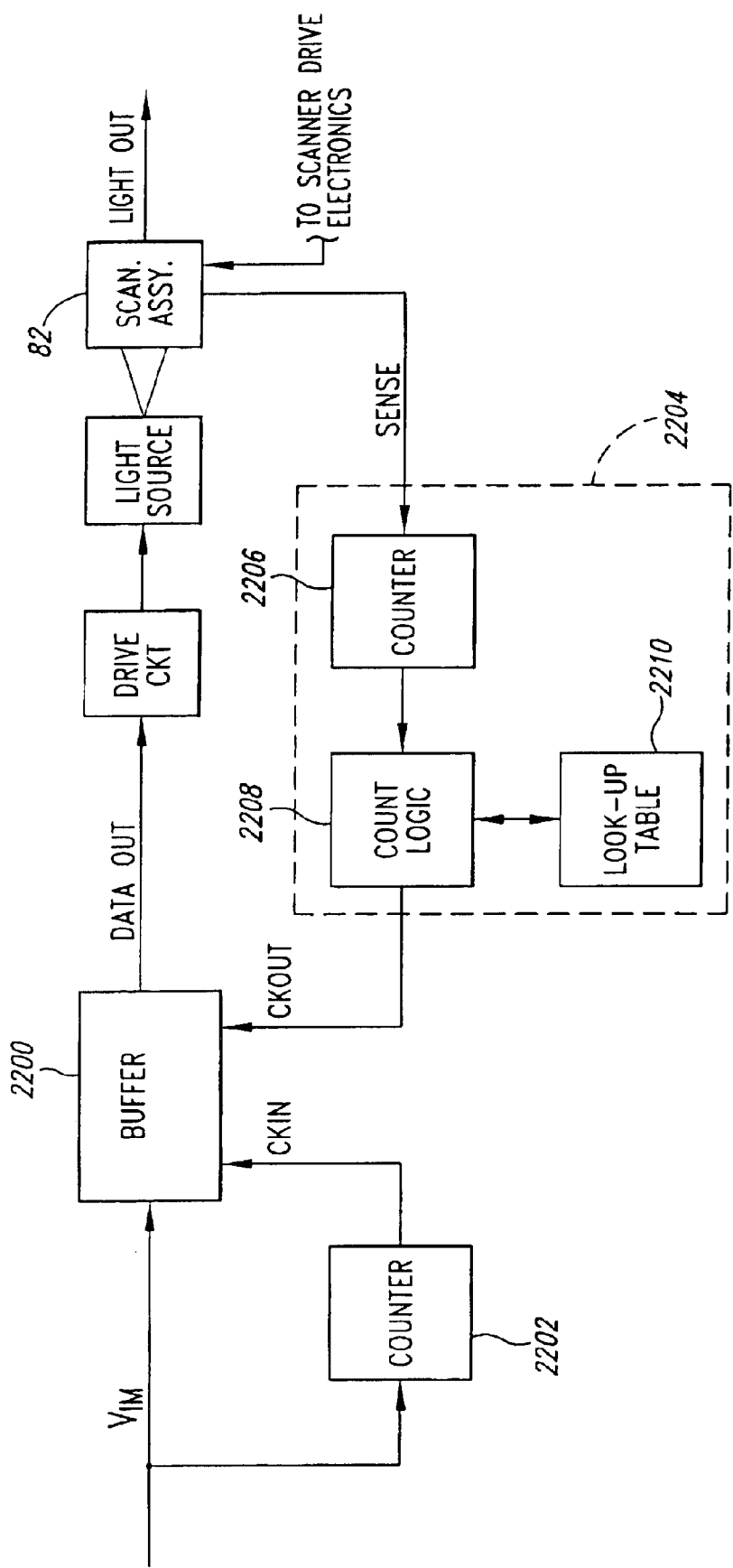
FIG. 28 is a system block diagram showing handling of data to store data in a memory matrix while compensating for nonlinear scan speed of the resonant mirror.

In addition to compensating for raster pinch, one embodiment of the scanning system, shown in FIG. 28, also addresses effects of the nonlinearity of resonant and other nonlinear scanning systems. One skilled in the art will recognize that, although this correction is described for a single light source or single detector system, the approaches described herein are applicable to systems using more than one light source, as presented in FIG. 10 above. For example, in one application, the corrected output clock signal described below with reference to FIG. 28, drives all of the buffers 1306A–D (FIG. 13) to output data in parallel from buffers 1306A–D.

Figure 26:
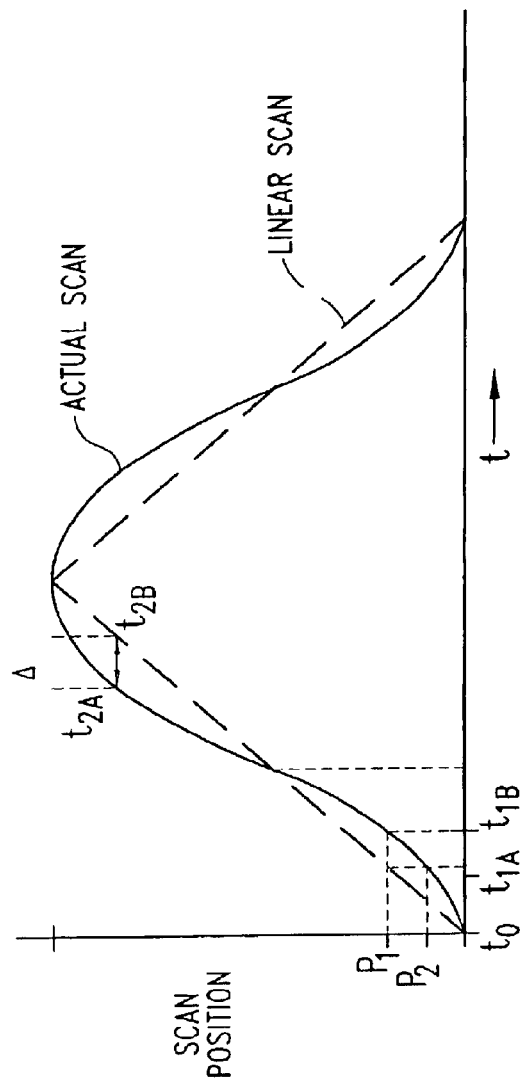
FIG. 26 is a signal timing diagram showing deviation of a sinusoidal scan position versus time from the position of a linear scan.

As shown by broken line in FIG. 26, the timing of incoming data is premised upon a linear scan rate. That is, for equally spaced subsequent locations in a line, the data arrive at constant intervals. A resonant scanner, however, has a scan rate that varies sinusoidally, as indicated by the solid line in FIG. 26. For a start of line beginning at time $t_0$ (note that the actual start of scan for a sinusoidal scan would likely be delayed slightly as described above with respect to FIG. 26), the sinusoidal scan initially lags the linear scan. Thus, if the image data for position $P_1$ arrive at time $t_{1A}$, the sinusoidal scan will place the pixel at position $P_2$.

To place the pixel correctly, the system of FIG. 28 delays the image data until time $t_{1B}$, as will now be described. As shown in FIG. 28, arriving image data $V_{IM}$ are clocked into a line or frame buffer 2200 by a counter circuit 2202 in response to a horizontal synchronization component of the image data signal. The counter circuit 2202 is a conventional type circuit, and provides an input clock signal having equally spaced pulses to clock the data into the buffer 2200. In the multisource system of FIG. 13, the four buffers 1306A–D, and demultiplexer 1304 replace the frame buffer and the image data are clocked sequentially through the demultiplexer 1304 into the four buffers 1306A–D, rather than being clocked into a single frame buffer or line buffer.

A feedback circuit 2204 controls timing of output from the buffer 2200 (or buffers 1306A–D of FIG. 13). The feedback circuit 2204 receives a sinusoidal or other sense signal from the scanning assembly 82 and divides the period of the sense signal with a high-speed second counter 2206. A logic circuit 2208 produces an output clock signal in response to the counter output.

Unlike the input clock signal, however, pulses of the output clock signal are not equally spaced. Instead, the pulse timing is determined analytically by comparing the timing of the linear signal of FIG. 26 to the sinusoidal signal. For example, for a pixel to be located at position $P_1$, the logic circuit 2208 provides an output pulse at time $t_{1B}$, rather than time $t_{1A}$, as would be the case for a linear scan rate.

Figure 27:
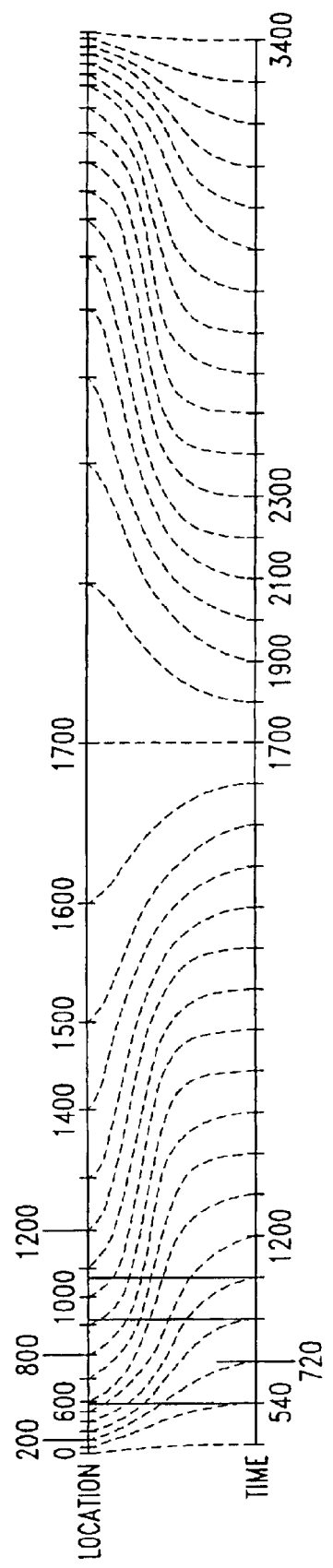
FIG. 27 is a diagram showing diagrammatically how a linear set of counts can map to scan position for a sinusoidally scan.

The logic circuit 2208 identifies the count corresponding to a pixel location by accessing a look-up table in a memory 2210. Data in the look-up table 2210 are defined by dividing the scanning system period into many counts and identifying the count corresponding to the proper pixel location. FIG. 27 shows this evaluation graphically for a 35-pixel line. One skilled in the art will recognize that this example is simplified for clarity of presentation. A typical line may include hundreds or even thousands of pixels. As can be seen, the pixels will be spaced undesirably close together at the edges of the field of view and undesirably far apart at the center of the field of view. Consequently, the image will be compressed near the edges of the field of view and expanded near the middle, thereby forming a distorted image.

As shown by the upper line, pixel location varies nonlinearly for pixel counts equally spaced in time. Accordingly, the desired locations of each of the pixels, shown by the upper line, actually correspond to nonlinearly spaced counts. For example, the first pixel in the upper and lower lines arrives at the zero count and should be located in the zero count location. The second pixel arrives at the 100 count, but, should be positioned at the 540 count location. Similarly, the third pixel arrives at count 200 and is output at count 720. One skilled in the art will recognize that the figure is merely representative of the actual calculation and timing. For example, some output counts will be higher than their corresponding input counts and some counts will be lower. Of course, a pixel will not actually be output before its corresponding data arrives. To address this condition, the system of FIG. 28 actually imposes a latency on the output of data, in a similar fashion to synchronous memory devices. For the example of FIG. 27, a single line latency (3400 count latency) would be ample. With such a latency, the first output pixel would occur at count 3400 and the second would occur at count 3940.

Figure 29:
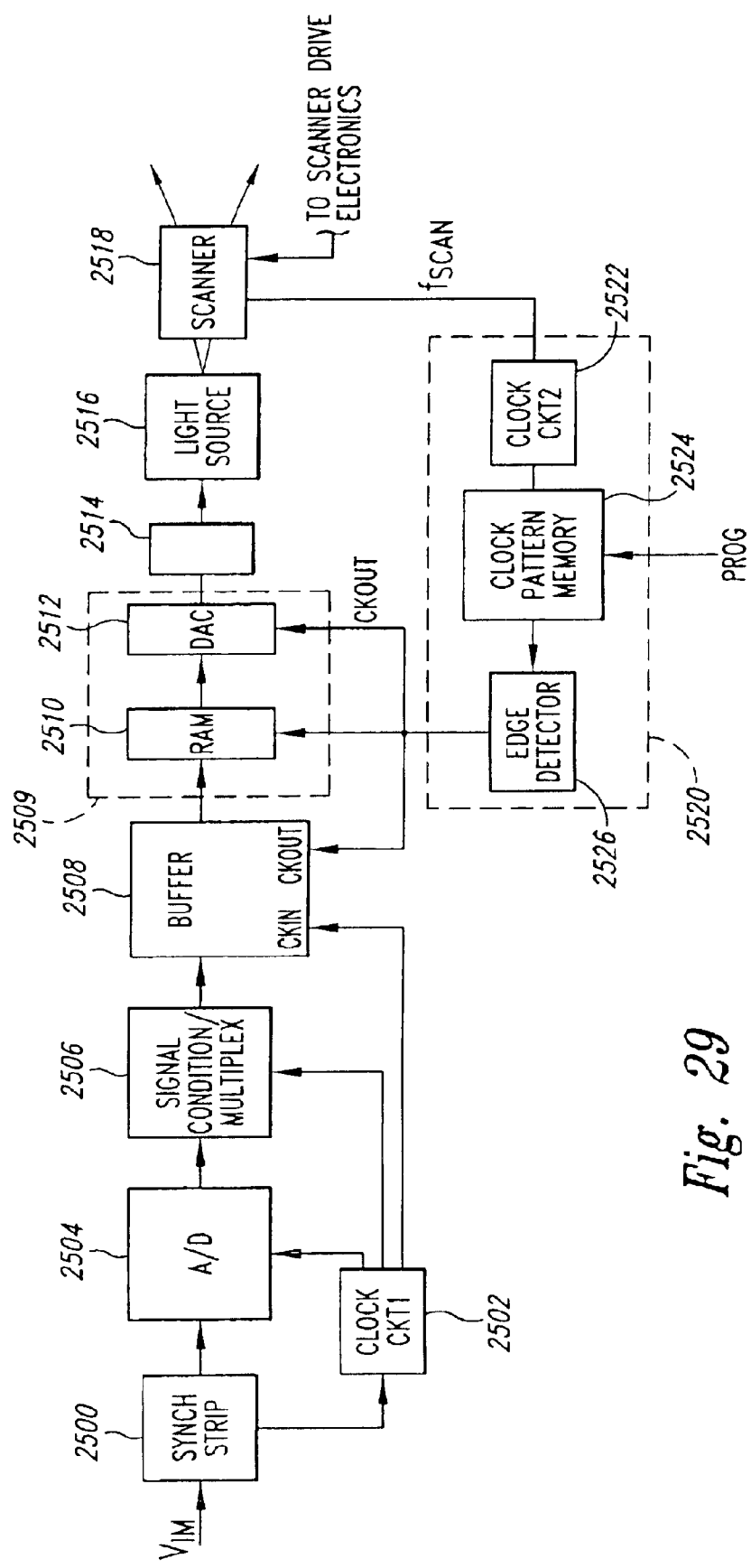
FIG. 29 is a block diagram of a first system for generating an output clock to retrieve data from a memory matrix while compensating for nonlinear scan speed of the resonant mirror.

FIG. 29 shows an alternative approach to placing the pixels in the desired locations. This embodiment produces a corrected clock from a pattern generator rather than a counter to control clocking of output data. A synch signal stripper 2500 strips the horizontal synchronization signal form an arriving image signal $V_{IM}$. Responsive to the synch signal, a phase locked loop 2502 produces a series of clock pulses that are locked to the synch signal. An A/D converter 2504, driven by the clock pulses, samples the video portion of the image signal to produce sampled input data. The sampling rate will depend upon the required resolution of the system. In the preferred embodiment, the sampling rate is approximately 40 Mhz. A programmable gate array 2506 conditions the data from the A/D converter 2504 to produce a set of image data that are stored in a buffer 2508. One skilled in the art will recognize that, for each horizontal synch signal, the buffer will receive one line of image data. For a 1480×1024 pixel display, the system will sample and store 1480 sets of image data during a single period of the video signal.

Once each line of data is stored in the buffer 2508, the buffer is clocked to output the data to a RAMDAC 2509 that includes a gamma correction memory 2510 containing corrected data. Instead of using the buffer data as a data input to the gamma correction memory 2510, the buffer data is used to produce addressing data to retrieve the corrected data from the gamma correction memory 2510. For example, a set of image data corresponding to a selected image intensity I1 identifies a corresponding location in the gamma correction memory 2510. Rather than output the actual image data, the gamma correction memory 2510 outputs a set of corrected data that will produce the proper light intensity at the user's eye. The corrected data is determined analytically and empirically by characterizing the overall scanning system, including the transmissivity of various components, the intensity versus current response of the light source, diffractive and aperture effects of the components and a variety of other system characteristics.

Figure 30:
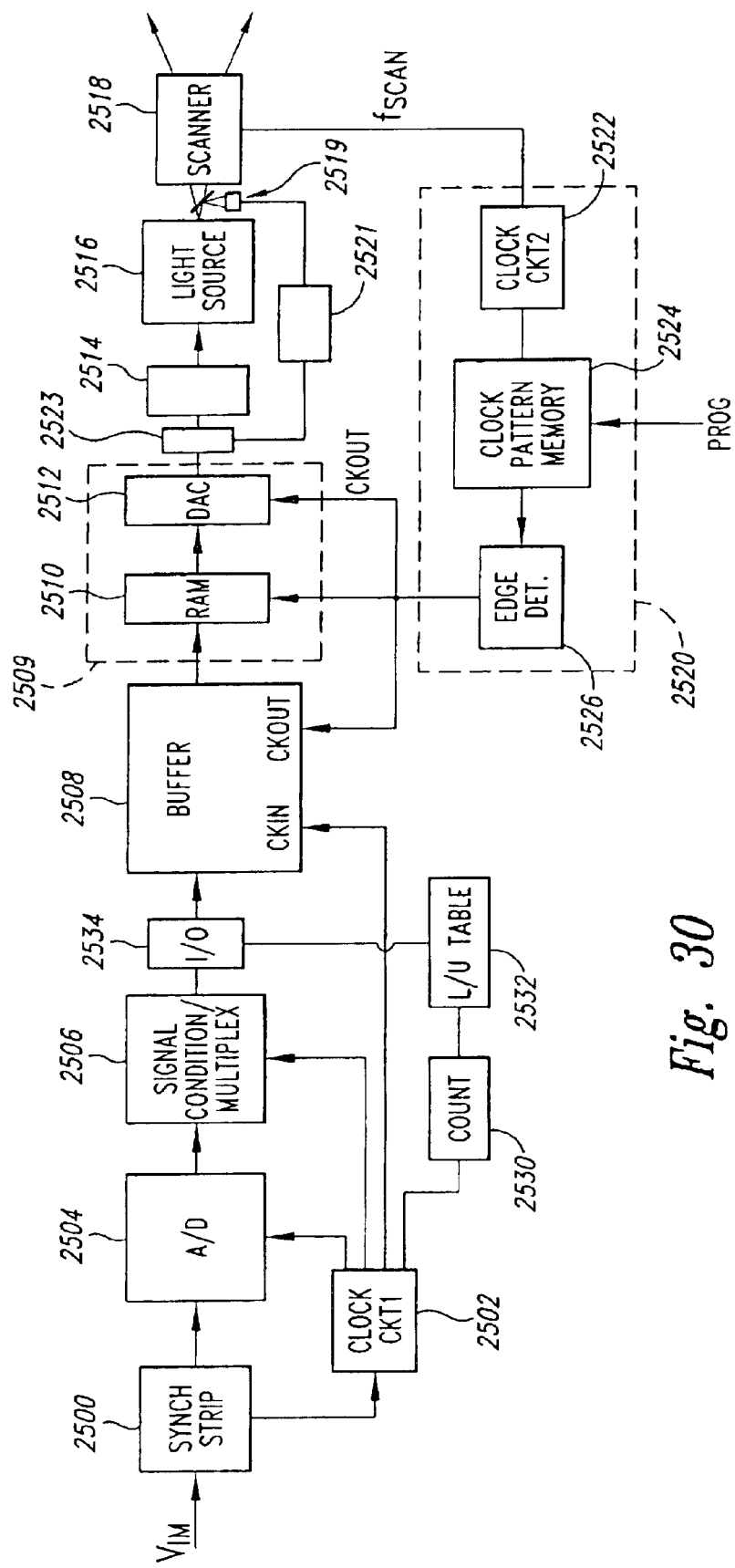
FIG. 30 is a block diagram of an alternative embodiment of the apparatus of FIG. 29 including pre-distortion.

In one embodiment shown in FIG. 30 according to the invention, the data may be corrected further for temperature-versus-intensity or age-versus-intensity variations of the light source. Reference data drives the light source while the vertical and horizontal position is out of the user's field of view. For example, at the edge of the horizontal scan, the reference data is set to a predetermined light intensity. A detector 2519 monitors the power out of the light source 2516 and a temperature compensation circuit 2521. If the intensity is higher than the predetermined light intensity, a gain circuit 2523 scales the signal from the RAMDAC 2506 by a correction factor that is less than one. If the intensity is higher than the predetermined light intensity, the correction factor is greater than one. While the embodiments described herein pick off a portion of the unmodulated beam or sample the beam during non-display portions of the scanning period, the invention is not so limited. For example,, a portion of the modulated beam can be picked off during the display portion of the scanning period or continuously. The intensity of the picked off portion of the modulated beam is then scaled and compared to the input video signal to determine shifts in the relative intensity of the displayed light versus the desired level of the displayed light to monitor variations.

In addition to monitoring the intensity, the system can also compensate for pattern dependent heating through the same correction data or by multiplying by a second correction factor. For example, where the displayed pattern includes a large area of high light intensity, the light source temperature will increase due to the extended period of high level activation. Because data corresponding to the image signal is stored in a buffer, the data is available prior to the actual activation. of the light source 2516. Accordingly, the system can "look-ahead" to predict the amount of heating produced by the pattern. For example, if the light source will be highly activated for the 50 pixels preceding the target pixel, the system can predict an approximate pattern dependent heat effect. The correction factor can then be calculated based upon the predicted pattern dependent heating. Although the correction has been described herein for the intensity generally, the correction in many embodiments can be applied independently for red, green and blue wavelengths to compensate for different responses of the emitters and for variations in pattern colors. Compensating for each wavelength independently can help limit color imbalance due to differing variations in the signal to intensity responses of the light emitters.

Returning to FIG. 29, the corrected data output from the gamma correction memory 2510 (as it may be modified for intensity variations) drives a signal shaping circuit 2514 that amplifies and processes the corrected analog signal to produce an input signal to a light source 2516. In response, the light source 2516 outputs light modulated according to the corrected data from the gamma correction memory 2510. The modulated light enters a scanner 2518 to produce scanned, modulated light for viewing.

The clock signal that drives the buffer 2508, correction memory 2510, and D/A converter 2512 comes from a corrected clock circuit 2520 that includes a clock generator 2522, pattern memory 2524 and rising edge detector 2526. The clock generator 2522 includes a phase locked loop (PLL) that is locked to a sense signal from the scanner 2518. The PLL generates a high frequency clock signal at about 80 MHz that is locked to the sense signal. The high frequency clock signal clocks data sequentially from addresses in the pattern memory 2524.

The rising edge detector 2526 outputs a pulse in response to each 0-to-1 transition of the data retrieved from the pattern memory 2524. The pulses then form the clock signal CKOUT that drives the buffer output, gamma correction memory 2510, and D/A converter 2512.

One skilled in the art will recognize that the timing of pulses output from the edge detector 2526 will depend upon the data stored in the pattern memory 2524 and upon the scanning frequency $f_{SCAN}$ of the scanner 2518. FIG. 31 shows a simplified example of the concept. One skilled in the art will recognize that, in FIG. 31, the data structure is simplified and addressing and other circuitry have also been omitted for clarity of presentation.

In the example of FIG. 31, if the scanning frequency $f_{SCAN}$ is 20 kHz and clock generator 2522 outputs a clock signal at 4000 times the scanning frequency $f_{SCAN}$, the pattern memory 2524 is clocked at 80 MHz. If all bits in an addressed memory location 2524A are 0, no transitions of the output clock occur for 16 transitions of the generator clock. For the data structure of location 2524B, a single transition of the output clock occurs for 16 transitions of the generator clock. Similarly, location 2524C provides two pulses of the generator clock in one period of the scan signal and location 2524E provides eight pulses of the generator clock in one period.

The number and relative timing of the pulses is thus controlled by the data stored in the pattern memory 2524. The frequency of the generator clock on the other hand depends upon the scanner frequency. As the scanner frequency varies, the timing of the pulses thus will vary, yet will depend upon the stored data in the pattern memory.

The approaches of FIGS. 29 and 30 are not limited to sinusoidal rate variation correction. The clock pattern memory 2524 can be programmed to address many other kinds of nonlinear effects, such as optical distortion, secondary harmonics, and response time idiosyncrasies of the electronic and optical source.

Moreover, the basic structure of FIG. 29 can be modified easily to adapt for vertical scanning errors or optical distortion, by inserting a bit counter 2530, look up table 2532, and vertical incrementing circuit 2534 before the buffer 2508, as shown in FIG. 30. The counter 2530 addresses the look up table 2532 in response to each pulse of the input clock to retrieve two bits of stored data. The retrieved data indicate whether the vertical address should be incremented, decremented or left unaffected. The data in the look up table 2532 is determined empirically by measuring optical distortion of the scanning system and optics or is determined analytically through modeling. If the address is to be incremented or decremented, the incrementing circuit increments or decrements the address in the buffer 2508, so that data that was to be stored in a nominal memory location are actually stored in an alternate location that is one row higher or lower than the nominal location.

A graphical representation of one such data structure is shown in the simplified example FIG. 32. In this example, the first three sets of data bits 3202 for the first line of data (line 0) are stored in the first memory row, the next three sets of data bits 3204 for the first line are stored in the second memory row, and the last three sets of data bits are stored in the third memory row. One skilled in the art will recognize that this example has been greatly simplified for clarity of presentation. An actual implementation would include many more sets of data and may utilize decrementing of the row number as well as incrementing.

The result is that some portion of the data for one line is moved to a new line. The resulting data map in the buffer 2508 is thus distorted as can be seen from FIG. 32. However, distortion of the data map can be selected to offset vertical distortion of the image caused by scanning and optical distortion. The result is that the overall system distortion is reduced. Although the embodiment of FIG. 30 shows correction of vertical distortion by adjusting the position of data stored in the buffer 2508, other approaches to this correction may be implemented. For example, rather than adjusting the addresses of the storage locations, the addresses used for retrieving data from the buffer 2508 to the RAMDAC 2509 can be modified.

As noted above, in many applications, it is desirable to control the scanning frequencies of one or more scanners. In non-resonant or low Q applications, simply varying the frequency of the driving signal can vary the scanning frequency. However, in high Q resonant applications, the amplitude response of the scanners may drop off dramatically if the driving signal differs from the resonant frequency of the scanner. Varying the amplitude of the driving signal can compensate somewhat, but the magnitude of the driving signal may become unacceptably high in many cases. Consequently, it is undesirable in many applications to try to control the scanner frequency $f_{SCAN}$ simply by controlling the driving signal frequency and/or amplitude.

Figure 33:
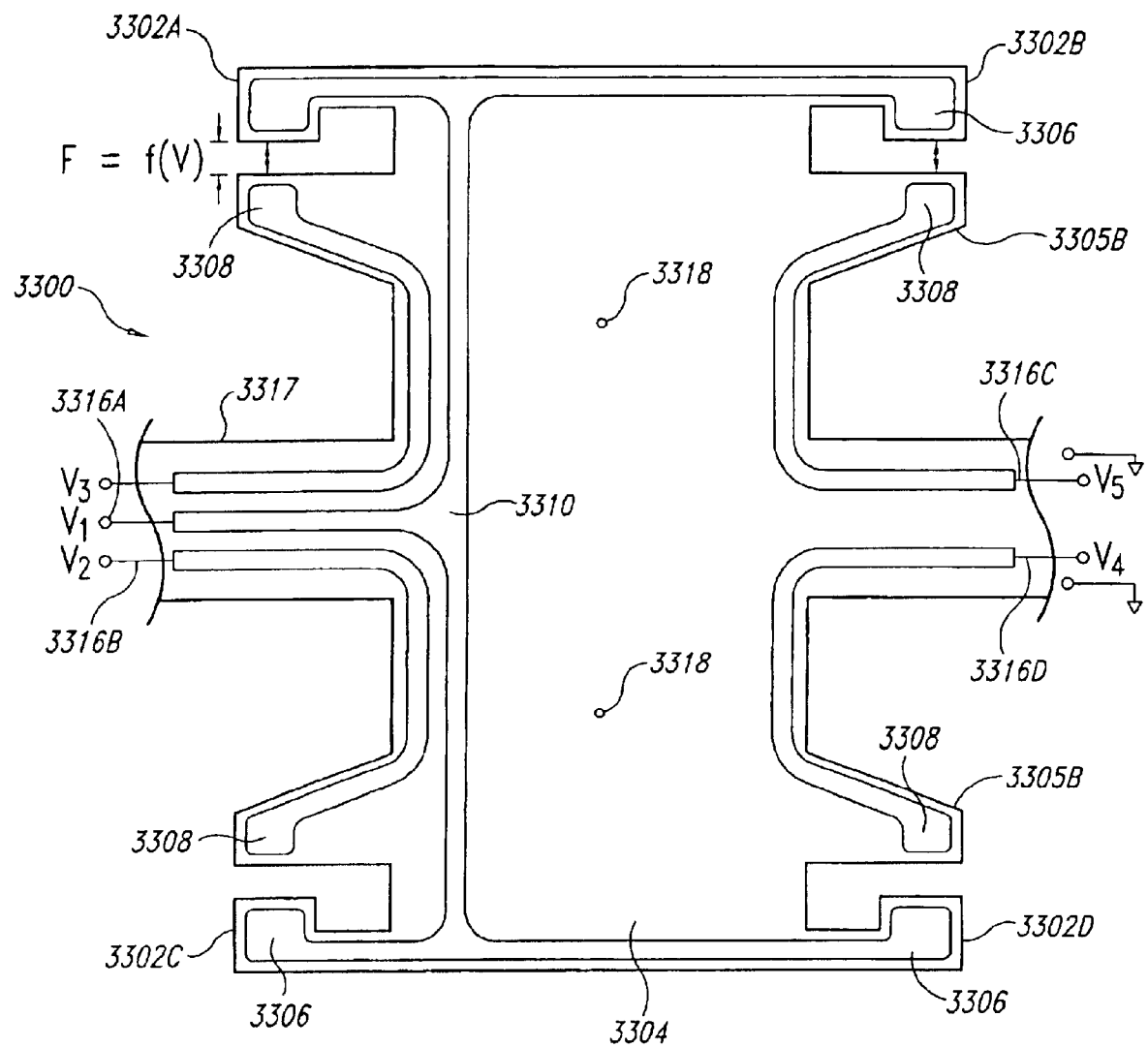
FIG. 33 is a top plan view of a MEMs scanner including structures for electronically controlling the center of mass of each mirror half.
Figure 34:
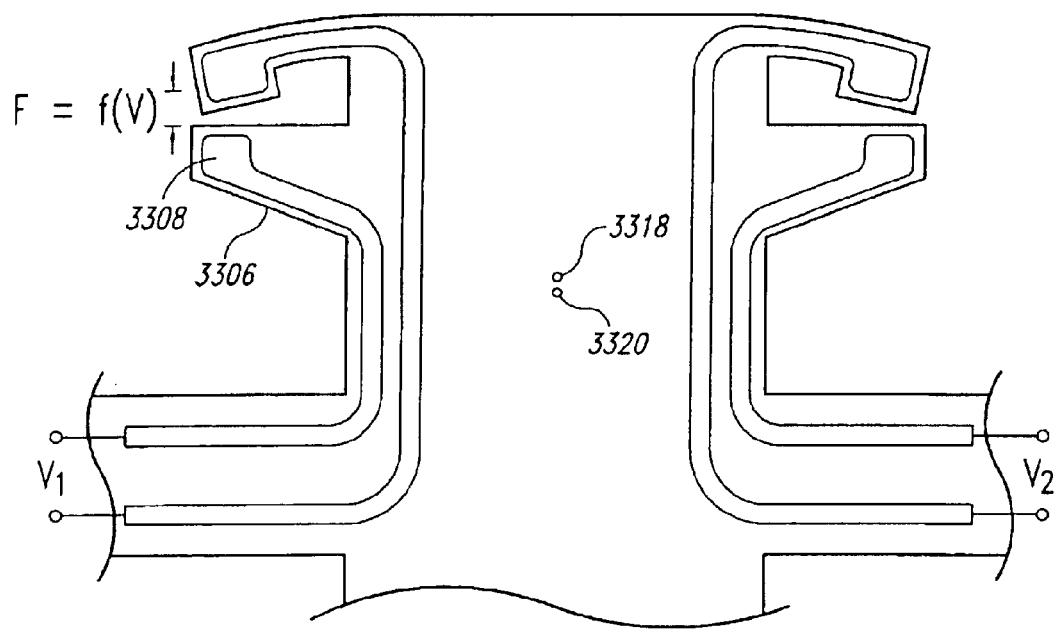
FIG. 34 is a top plan view of the MEMs scanner of FIG. 32 showing flexing of protrusions in response to an applied voltage.
Figure 35:
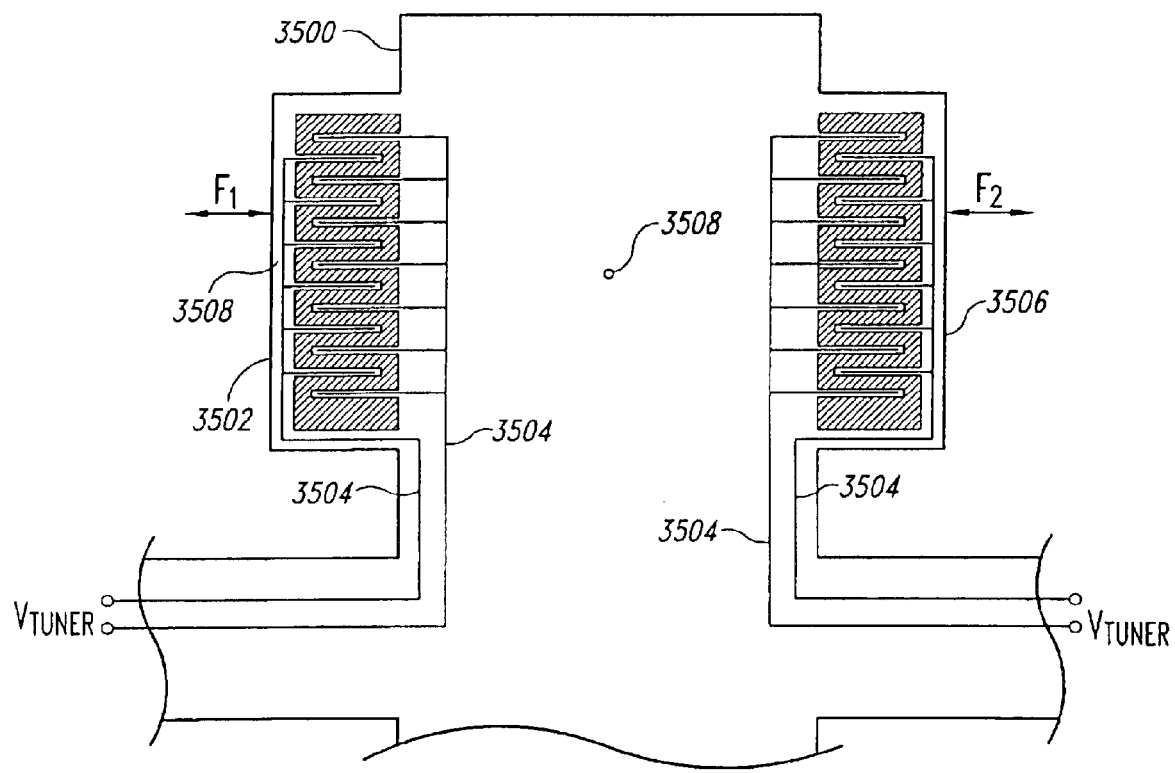
FIG. 35 is a top plan view of a MEMs scanner including comb structures for laterally shifting the center of mass of each mirror half.

One approach to controlling the frequency $f_{SCAN}$ is shown in FIGS. 33 and 34 for a MEMs scanner 3300. The scanner 3300 includes four tuning tabs 3302A–D positioned at corners of a mirror body 3304. The tuning tabs 3302A–D are flexible projections that are integral to the mirror body 3304. Fixed rigid projections 3305 project from the mirror body 3304 adjacent to the tuning tabs 3302A–D, leaving a small gap therebetween.

Each of the tuning tabs 3302A–D carries a ground electrode 3306 coupled by a conductor 3310 to an external electrode 3312 to form an electrical reference plane adjacent to the respective tab 3302A–D. Each of the rigid projections 3306A–D carries a respective hot electrode 3308 controlled by a respective external electrode 3316A–D, that allows control of the voltage difference between each tuning tab 3302A–D and its corresponding rigid projection 3306A–D.

Each flexible tab 3302A–D is dimensioned so that it bends in response to an applied voltage difference between the tab 3302A–D and the adjacent rigid projection 3306, as shown in FIG. 34. The amount of bending will depend upon the applied voltage, thereby allowing electrical control of tuning tab bending.

One skilled in the art will recognize that the resonant frequency of the scanner 3300 will be a function of the mass of the mirror 3304, the dimensions and mechanical properties of torsion arms 3317 supporting the mirror 3304, and the locations 3318 of the centers of mass of each half of the mirror 3304 (including its tabs 3302A–D and rigid projections 3306) relative to the axis of rotation of the mirror 3304. Bending the flexible tabs shifts the centers or mass slightly inwardly from the original locations 3318 to new locations 3320. Because the centers of mass are located closer to the axis of rotation, the scanning frequency increases slightly. Increasing the voltage on the fixed projections 3306 thus can increase the resonant frequency of the scanner 3300.

The use of electronically controlled elements to control resonance in a scanner is not limited to controlling the horizontal scanning frequency. For example, in the embodiment of FIG. 35, a mirror body 3500 has interdigitated comb drives 3502 that extend from the body's edges. Comb driven actuators are known structures, being described for example in Tang, et al., ELECTROSTATIC-COMB DRIVE OF LATERAL POLYSILICON RESONATORS, Transducers '89, Proceedings of the $5^{th}$ International Conference on Solid State Sensors and Actuators and Eurosensors III, Vol. 2, pp. 328–331, June 1990, which is incorporated herein by reference.

Respective conductors 3504 extend from each of the comb drives 3502 to allow tuning voltages Vtune1, Vtune2 to control the comb drives 3502. As is known, applied voltages produces lateral forces F1, F2 in the comb drives 3502. Flexible arms 3506 at the distal ends of the comb drives 3502 bend in response to the forces F1, F2, thereby shifting the mass of the flexible arms 3506 relative to the center of mass 3508 of the respective half of the mirror body. Because the position shift is parallel to the axis of rotation of the mirror body 3500, the horizontal resonant frequency does not shift significantly. However, if the voltages are set such that the flexible arms experience different position shifts, the mirror body 3500 can be made slightly unbalanced. The mirror body 3500 will then begin to approximate the Lissajous pattern of FIG. 20. Adjusting the tuning voltages Vtune1, Vtune2 produces a corresponding adjustment in the scan pattern. Where the masses of the flexible portions 3506 and the voltages Vtune1, Vtune2 are chosen appropriately, the resonant frequency of vibrations from the unbalanced mirror body will be an integral multiple of the horizontal scanning frequency and the Lissajous pattern will be stable. By monitoring the scan pattern and adjusting the tuning voltages Vtune1, Vtune2 accordingly, the Lissajous pattern can be kept stable. Thus, the electronically controlled structures can assist in pinch correction.

Figure 36:
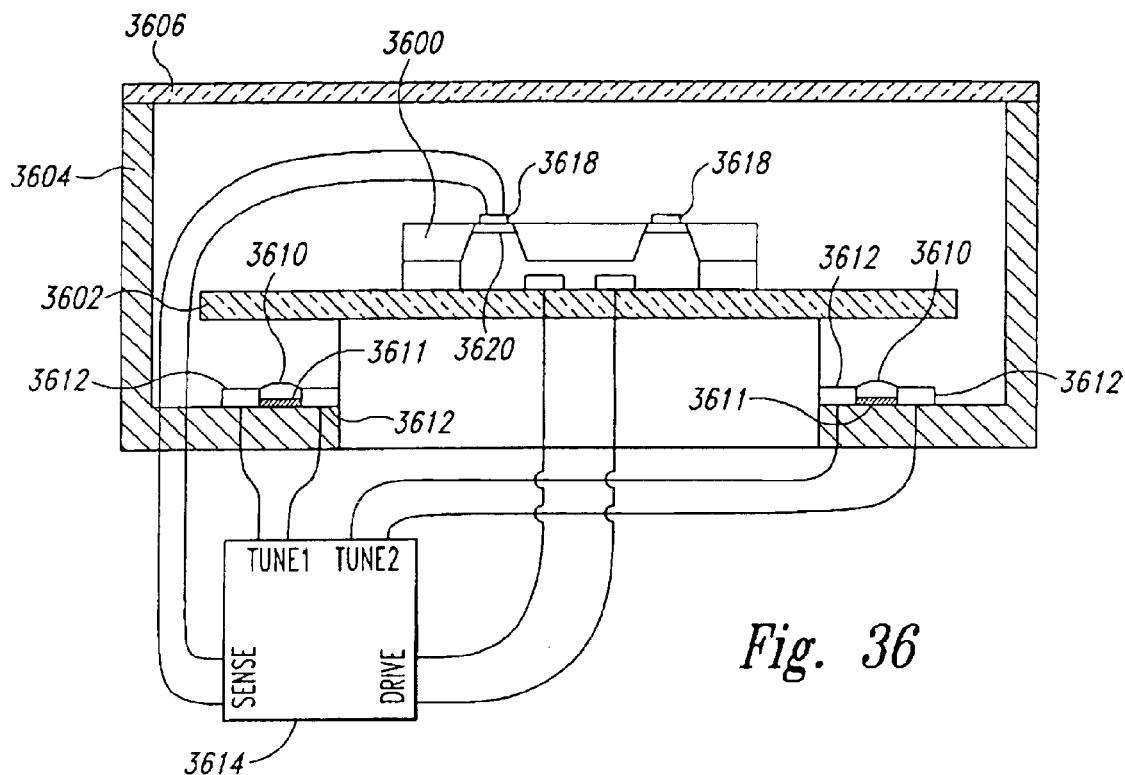
FIG. 36 is a side cross sectional view of a packaged scanner including electrically controlled outgassing nodules.

FIG. 36 shows an alternative approach to controlling the resonant frequency of a scanner 3600. In this embodiment, the scanner 3600 is housed on a platform 3602 in a sealed package 3604 having a transparent lid 3606. The package 3604 also contains a gas, such as a helium or argon mix, at a low pressure. The resonant frequency of the scanner 3600 will depend, in part, upon the pressure of within the package 3602 and the properties of the gas, as is described in Baltes et. al., THE ELECTRONIC NOSE IN LILLIPUT, IEEE Spectrum, September 1998, pp. 35–39, which is incorporated here by reference. Unlike conventional sealed packages, the package 3602 includes a pair of outgassing nodules 3610 concealed beneath the platform 3602.

The nodules 3610 are formed from an outgassing material, such as isopropanol in a polymer, atop a resistive heater 3611. Electrical current causes resistive heating of the heater 3611, which, in turn causes the nodule 3610 to outgas. An electronic frequency controller 3614, controls the amount of outgassing by applying a controlled current through pairs of electrodes 3612 positioned on opposite sides of each of the nodules 3610. The increased gas concentration or increase in the partial pressure of the selected gas reduces the resonant frequency of the scanner 3600. For greater frequency variation, absorptive polymer segments 3618 coat the scanners torsion arms 3620 to "amplify" the absorptive effect on resonant frequency. While an electrically controlled outgassing is described for the above embodiment, a variety of other approaches to controlling the partial pressure of a gas may be employed.

For example, the package 3604 may include walls of a piezoelectric material or other piezoelectric structures that can compress the package 3604 to reduce the volume within the package 3604, thereby increasing the overall pressure within the package 3604. The increased overall pressure increases absorption by the polymers segments 3618 to vary the resonant frequency. It should be noted that, in this approach, the increased pressure would affect the resonant frequency even in the absence of the absorptive polymers, since resonant frequency can be affected by the pressure of the surrounding environment. Thus, in an alternative approach, the resonant frequency response is controlled by simply controlling the pressure within the package 3604, with or without the polymer segments 3618.

In still another approach, the absorptive polymer or another absorptive material can be placed on the mirror body 3500 (FIG. 35) in a position offset from the axis of rotation. Increasing the partial pressure of a selected gas causes increased absorption of the gas, thereby increasing the mass that is offset from the axis of rotation. The increased mass reduces the resonant frequency of the system. Thus, selectively controlling gas absorption controls the resonant frequency.

As described above, gas absorption may be made responsive to an electrical input. In turn, conventional control system approaches can make the electrical input responsive to differences between the monitored resonant frequency and a desired resonant frequency, to "lock" the actual resonant frequency to the desired resonant frequency. This approach can be particularly useful in applications where it is desirable to have the scanning frequency matched to another frequency, such as a horizontal synchronization component of a video signal or a desired line rate of a symbol reader or video camera.

Typically, the above-described variable or "active" tuning approaches are most desirable for producing small frequency variations. For example, such small frequency adjustments can compensate for resonant frequency drift due to environmental effects, aging, or internal heat buildup. To reduce the difficulty of active tuning approaches or to eliminate active tuning entirely, it is desirable in many applications to "tune" the resonant frequency of a scanner to minimize the difference between the scanner's uncompensated resonant frequency and the desired scan frequency. Such frequency differences may be caused by processing variations, material property variations, or several other effects.

Figure 37:
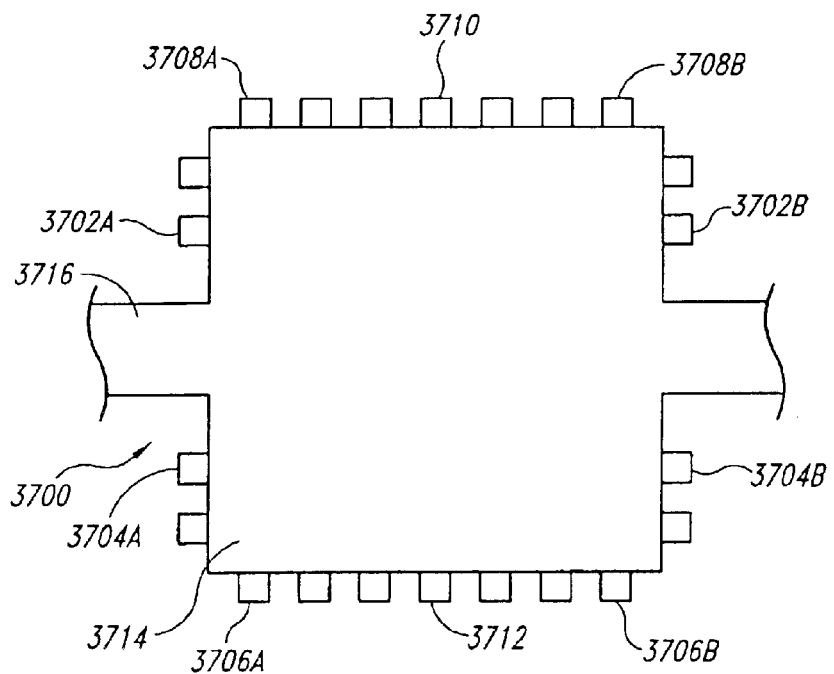
FIG. 37 is a top plan view of a MEMs mirror including selectively removable tabs for frequency tuning.

FIG. 37 shows one approach to tuning the scanner's uncompensated resonant frequency, in which a scanner 3700 is fabricated with integral tuning tabs 3702A–B, 3704A–B, 3706A–B, 3708A–B, 3710, and 3712. Initially, the scanner's mirror body 3714 and torsional arms 3716 are dimensioned to produce a resonant frequency (with all of the tuning tabs 3702A–B, 3704A–B, 3706A–B, 3708A–B, 3710, and 3712 attached) that is slightly below the desired resonant frequency. Once the scanner 3700 is assembled, the resonant frequency can be measured in a variety of fashions. For example, the scanner 3700 can be driven in one of the techniques described previously and the mirror response can be monitored optically. Alternatively, impedance versus frequency measurements may also provide the resonant frequency relatively quickly.

The determined resonant frequency is then compared to the desired resonant frequency to identify a desired frequency compensation. Based upon the identified frequency compensation some of the tuning tabs 3702A–B, 3704A–B, 3706A–B, 3708A–B, 3710, and 3712 can be removed, for example by laser trimming or mechanical force to reduce the mass of the mirror body 3714. As is known, lowering the mass of the mirror body 3714 (in the absence of other variations) will increase the resonant frequency. The number and position of the tabs to be removed for the identified frequency compensation can be determined through modeling or empirical data. Preferably, the removed tuning tabs are positioned symmetrically relative to the center of mass of the respective half of the mirror body and with respect to the axis of rotation of the mirror body 3714. To make this symmetricity easier, the tuning tabs 3702A–B, 3704A–B, 3706A–B, 3708A–B, 3710, and 3712 are positioned in the symmetric locations about the mirror body 3714. For example, tuning tabs 3702A–B and 3704A–B form a quartet of tabs that would typically be removed as a group. Similarly, tuning tabs 3710 and 3712 form a pair of tabs that would typically be removed as a pair.

While the tuning tabs 3702A–B, 3704A–B, 3706A–B, 3708A–B, 3710, and 3712 in FIG. 37 are shown as equally sized for ease of presentation, it is not always necessary or even desirable to make them the same size. In some applications, such tabs may be variably sized to allow greater flexibility in tuning.

Figure 38:
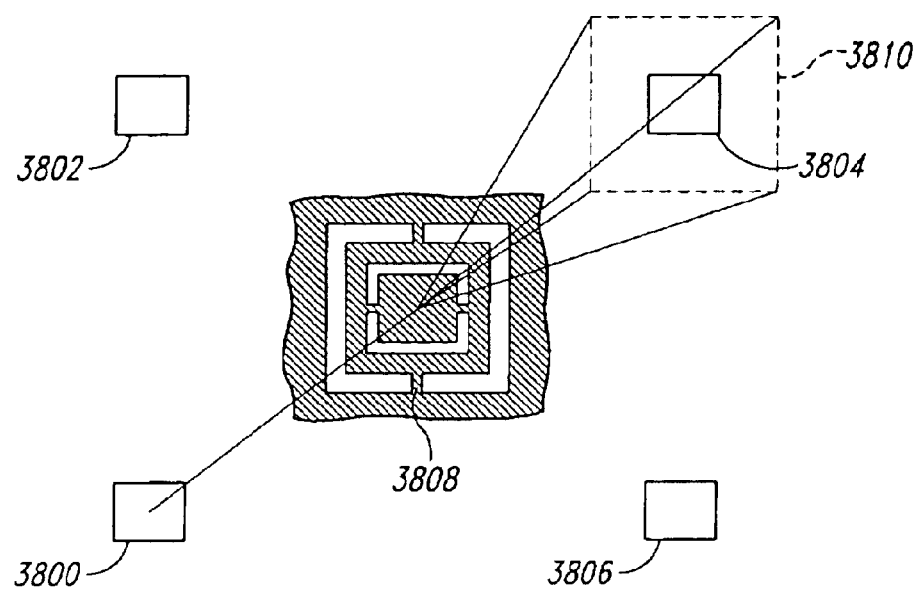
FIG. 38 is a diagrammatic view of a four source display showing overlap of scanning fields with optical sources.

As described above with respect to FIG. 12, tiling in two dimensions can allow a large, high resolution display with less demand upon a scanner. FIG. 38 shows one difficulty that may arise when four separate sources 3800, 3802, 3804, 3806 feed a common scanner 3808. As can be seen from the ray tracing for the lower left scanner 3800, the upper right source 3804 is positioned within an expected scanning field 3810 of the lower left source 3800. With no further adjustment, the upper right source 3804 would be expected to occlude a portion of the image from the lower left source 3800, producing an unilluminated region in the corresponding tile.

Figure 39:
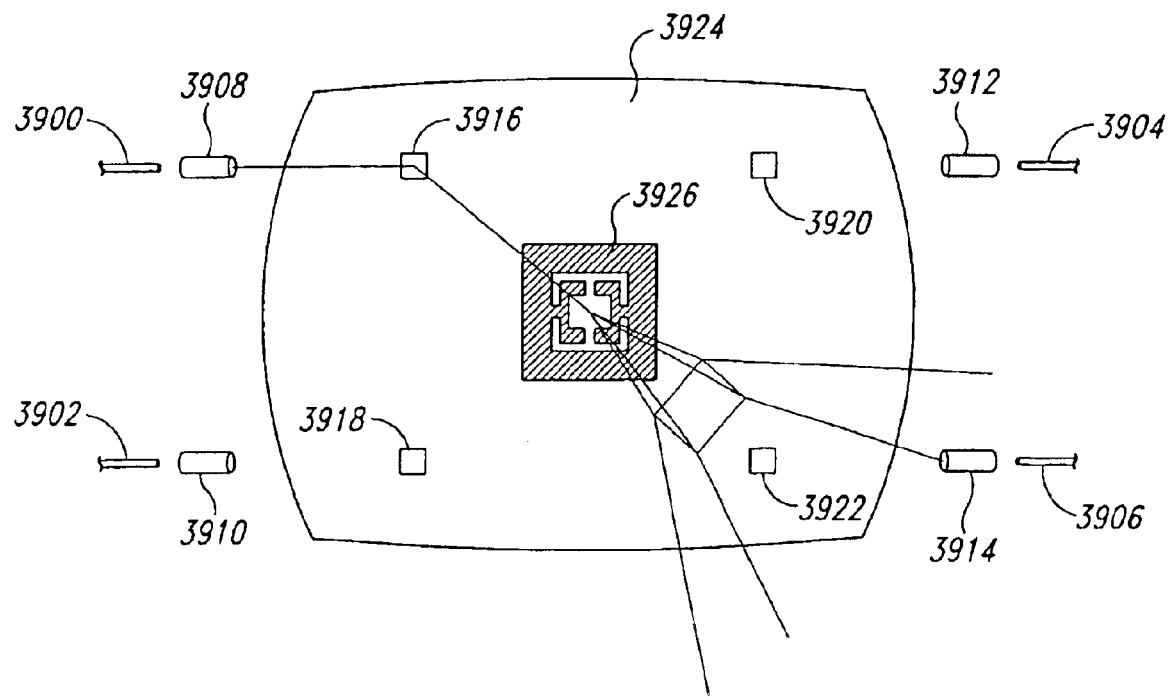
FIG. 39 is a diagrammatic view of a four source display with small turning mirrors and offset optical sources.

FIG. 39 shows one approach in which the effects of overlapping of sources and beams can be reduced. In this embodiment, light arrives through separate fibers 3900, 3902, 3904, 3906 and is gathered and focused by respective GRIN lenses 3908, 3910, 3912, 3914 onto respective turning mirrors 3916, 3918, 3920, 3922. As is visible for two of the mirrors 3916, 3922 in FIG. 40, the turning mirrors 3916, 3922 are very small mirrors that redirect light from their respective GRIN lenses 3908, 3914 toward a curved, partially reflective mirror 3924. The mirror 3924 returns the incident light toward a centrally positioned scanner 3926 that scans periodically, as described previously. The scanned light passes through the partially transmissive mirror 3924 toward an image field 3928 where an image can be viewed.

Figure 40:
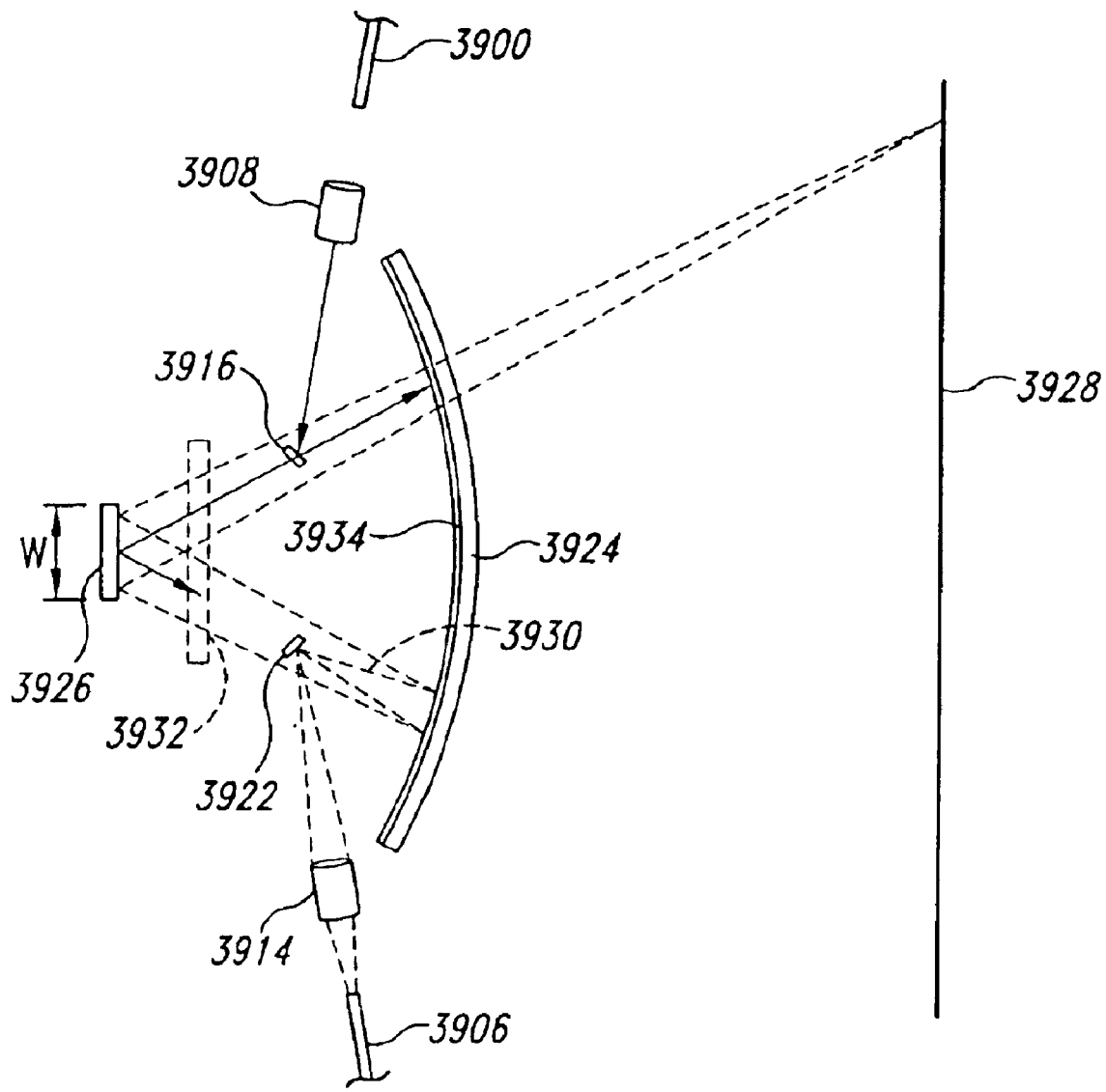
FIG. 40 is a diagrammatic view of the display of FIG. 39 showing beam paths with the small turning mirrors and a common curved mirror.

As can be seen in FIG. 40, the GRIN lenses 3908, 3914 gather diverging light from the respective fibers 3900, 3906 and reduce the beam width to substantially its minimum diameter at the respective turning mirror 3916, 3922. The beam 3930 then expands as it travels to the curved mirror 3924. The curved mirror 3924 converts the expanding beam 3930 into a substantially collimated or slightly converging beam 3932 having a diameter slightly smaller than the mirror width W of the scanner 3926.

It can be seen in FIG. 40 that the turning mirrors 3916, 3918, 3920, 3922 will block light from other turning mirrors during a portion of their scans. However, because the turning mirrors block only small section of the beams and because the beams converge at the image field 3924, the effect will be a slight dimming of the corresponding pixel. Uncompensated, this might produce a slight variation from the desired pixel intensity. However, the programmable gate array 2506 described above with respect to FIG. 29 can pre-weight the intensity to offset the dimming effects of the turning mirrors 3916, 3918, 3920, 3922.

To further improve efficiency the display of FIGS. 39 and 40 can also take advantage of properties of polarized light. In some applications, the fibers 3900, 3902, 3904, 3906 (or other light sources such as laser diodes) emit polarized light. A polarization dependent reflector 3934, such as 3M's Dual Brightness Enhancement Film coats the inner surface of the mirror and reflects the polarized incident beam 3930 As the reflected beam 3932 travels to the scanner 3926, the beam 3932 passes through a quarter wave plate that rotates the polarization by 45 degrees. The beam 3932 is then reflected by the scanner 3926 and passes through the quarter wave plate once again, so that the polarization rotates by a total of 90 degrees and is orthogonal to the original beam 3930. The orthogonally polarized beam passes efficiently through the polarization dependent reflector 3934 and travels to the image field 3928.

Figure 41:
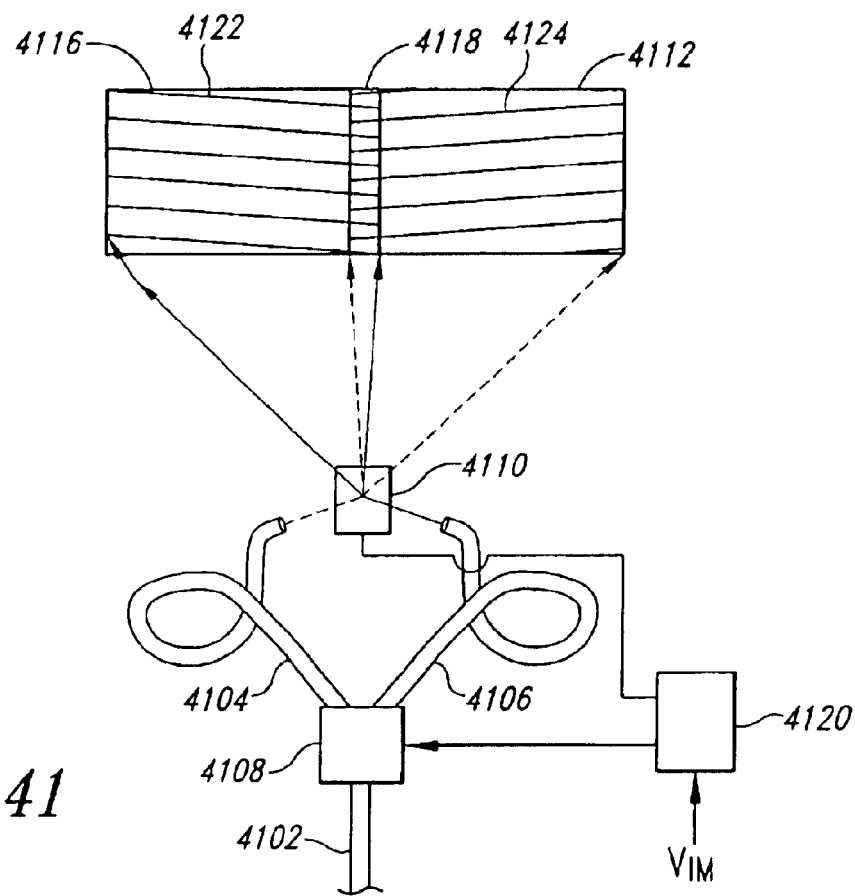
FIG. 41 is a diagrammatic view of a single emitter display including switched optical fibers each feeding a separate tile.

FIG. 41 shows how the use of a tiling approach can reduce raster pinch without a correction scanner. In this embodiment, modulated light from an input fiber 4102 enters one or the other of a pair of transmission fibers 4104, 4106 as dictated by an optical switch 4108. Light exits the transmission fibers 4104, 4106 and strikes a common scanner 4110 that scans light from the first fiber 4104 onto a first region 4112 of an image field 4114 and scans light from the second fiber 4106 onto a second region 4116 of the image field 4114. The fibers 4104, 4106 are oriented so that the first and second regions 4112, 4116 overlap very slightly in an overlap area 4118.

During forward sweeps of the scanner 4110, an electronic controller 4120 activates the switch 4108 so that light passes through the second fiber 4106. The scanner 4110 thus redirects the light along a first scan line 4122 in the second region 4116. At the end of the forward sweep, the controller 4120 activates the switch 4108 so that light now passes through the first fiber 4104 and is scanned along a first scan line 4124 in the first region 4112. For each subsequent sweep of the scanner 4110, the controller 4120 activates the switch to produce sets of lines in each of the regions 4112, 4116. Because the vertical scan continues during the forward sweeps, the lines may be slightly tilted, as shown in FIG. 41. While such tilt is typically not observable by a viewer, if desired, custom optics can produce a "counter"-tilt that offsets the scanning tilt. Alternatively, the image data may be predistorted by the programmable gate array 2506 described above with respect to FIG. 29 to compensate.

This structure is not limited to two horizontal tiles or to a single light emitter. For example, as shown in FIG. 42, light from two fibers can be switched into four fibers to produce a 2-by-2 tiled image.

In this approach, an input fiber 4200 is coupled to four fibers 4202, 4204, 4206, 4208 by a set of optical switches 4210, 4212, 4214, where each fiber feeds a scanning assembly 4216 from a respective angle. A switch controller 4220 activates the switches 4210, 4212, 4214 according to the direction of the sweep and according to the tracked location of the user's gaze, as provided by a gaze tracker (not shown). The gaze tracker may be any known apparatus for determining gaze direction.

For example, when the user looks at the top half of the image, a first fiber 4206, aligned to produce an image in the upper left tile 4222 feeds the scanning assembly 4216 during the forward sweeps. A second fiber 4208, aligned to produce an upper right tile 4224 feeds the scanning assembly 4216 during reverse sweeps. When the user looks at the lower half of the image, a third fiber 4204, aligned to produce the lower left tile 4226, feeds scanning assembly 4216 during forward sweeps. A fourth fiber 4202, aligned to produce the lower right tile 4228, feeds the scanning assembly 4216 during reverse sweeps. While each of the fibers 4200, 4206, 4208, 4204 is represented as a single fiber, in some applications each fiber 4200, 4206, 4208, 4204 may actually include a plurality of fibers 4200, 4206, 4208, 4204. In such applications each fiber 4200, 4206, 4208, 4204 is fed by a plurality of input fibers 4200 and a corresponding plurality of switch sets. Such an embodiment advantageously allows a plurality of lines to be written simultaneously. Writing a plurality of lines simultaneously reduces the frequency of the horizontal scanner relative to the single line writing approaches described above, thereby reducing the difficulty of scanning. Also, providing light simultaneously from a plurality of light emitters reduces the amount of light energy required from each source for a given display brightness and reduces the modulation frequency of the beam. This reduces the performance requirements of the light sources, thereby decreasing the cost and complexity of the overall display.

Figure 42:
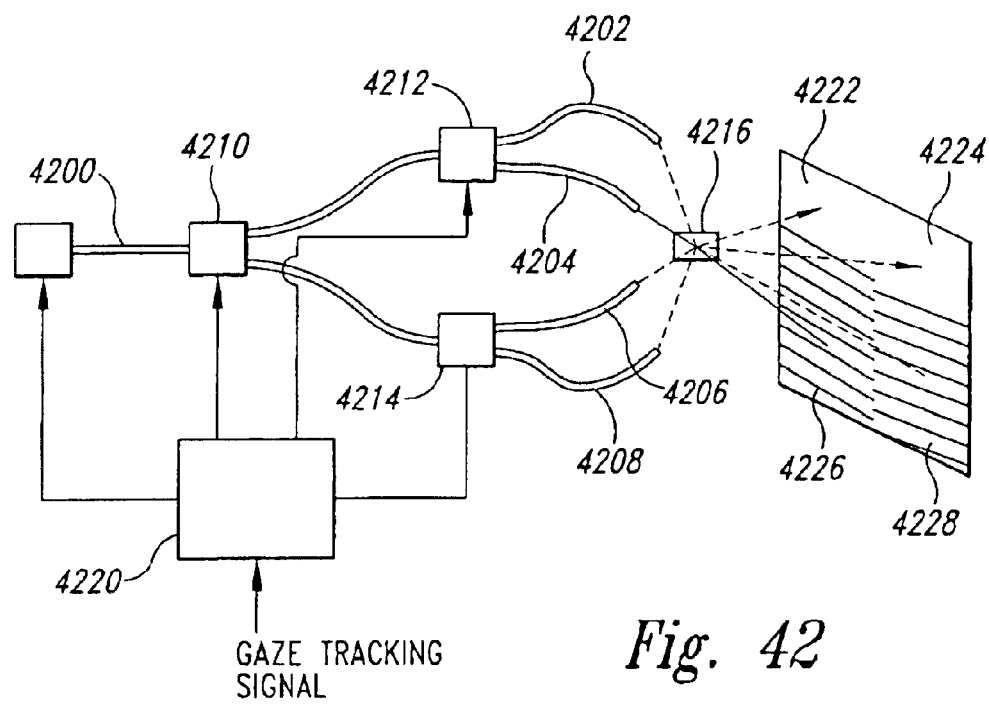
FIG. 42 is a diagrammatic view of a display including four separate fibers feeding a scanner through a set of optical switches in response to a detected gaze direction to produce four separate tiles.

While the embodiments of FIGS. 41 and 42 have been described herein using fibers and optical switches, in some applications, discrete light sources, such as laser diodes, LEDs, microlasers, or gas lasers may replace each fiber. In such applications, electrical switches (e.g., transistors) selectively control drive currents to the respective sources or control external modulators aligned with the respective sources to control feeding of light during forward an reverse sweeps of the mirror.

Although the invention has been described herein by way of exemplary embodiments, variations in the structures and methods described herein may be made without departing from the spirit and scope of the invention. For example, the positioning of the various components may also be varied. In one example of repositioning, the correction scanners can be positioned in the optical path either before or after the other scanners. Also, an exit pupil expander may be added or omitted in many applications. In such embodiments, conventional eye tracking may be added to ease coupling of the scanned beam to the eye. Moreover, the scanning system can be used for projection displays, optical storage and a variety of other scanned light beam applications, in addition to scanned retinal displays. Further, a variety of other timing control mechanisms, such as programmable delays, may be used to compensate for the variable speed of the scanner in place of the approaches described with reference to FIGS. 24–31. Additionally, in some applications it may be desirable for ease of positioning or for other reasons to use a plurality of scanners, each of which may be fed by one or more beams. In such a structure, each scanner and its corresponding light sources produce respective sets of tiles. The overall image is than formed by combining the sets of tiles from each of the scanners, either by adjacent positioning or by overlapping. Although overlapping is generally preferred only where each scanner is used for a respective wavelength, in some applications overlapping may be used for interlacing or other approaches to image combination.

In another alternative approach to timing and distortion correction, the memory map may be undistorted and addressed at a constant rate. To compensate for nonlinearity of the scanner, the data for each location is derived from the retrieved image data and output at fixed increments. Referring to FIG. 27, for example, data would be output at a time 1500, even though this time did not correspond directly to a pixel time. To compensate, the buffer 2508 is addressed at the $10^{th}$ and $11^{th}$ locations for this line. Then, the output data is a weighted average of the data from the $10^{th}$ and $11^{th}$ locations. Thus, the buffer 2508 is clocked at a constant rate and pixels are output at a constant rate. Yet, by controlling the addressing circuitry carefully and performing a weighted averaging, the output data is sinusoidally corrected. Also, although the light emitters and light sources described herein utilize laser diodes or LEDs, with or without fibers, a variety of other light emitters such as microlasers, gas lasers, or other light emitting devices may desirable in some applications. Moreover, although the exemplary scanning assemblies described herein utilize torsionally mounted mirrors, other scanning assembly structures, such as spinning polygons, comb drive mirrors, acousto-optic scanners, and other scanning structures may be within the scope of the invention. Also, while the beams are shown as converging upon a single scanner, in some applications it may be desirable to use separate scanners for each beam of light or to use a plurality of scanners that each reflect a plurality of beams. Accordingly, the invention is not limited except as by the appended claims.

What is claimed is:

1. A method of controlling a scanning motion of a MEMs device, comprising the steps of:

activating the MEMs device for periodic motion of a portion of the MEMs device relative to a reference point, the portion having a center of mass offset from the reference point by a selected distance;

monitoring the periodic motion of the MEMs device;

responsive to the monitored periodic motion of the MEMs device, identifying a deviation of the periodic motion from a desired periodic motion;

generating an error signal in response to the identified deviation; and responsive to the error signal, changing the selected distance.

2. The method of claim 1 wherein the step of activating the MEMs device for periodic motion of a portion of the MEMs device includes applying an electrical driving signal to the MEMs device.

3. The method of claim 1 wherein the step of changing the selected distance includes adding mass to or removing mass from the portion of the MEMs device.

4. The method of claim 1 wherein the MEMs device includes a torsional member that supports the portion of the MEMs device and wherein the step of monitoring the periodic motion of the MEMs device includes monitoring torsional stress in the torsional member.

5. The method of claim 1 wherein the step of monitoring the periodic motion of the MEMs device includes optically detecting movement or position of the portion.

6. The method of claim 1 further comprising the steps of:

receiving an input scanning signal; and determining from the received input scanning signal the desired periodic motion.

* * * * *